United States Patent [19]
Beat

[11] Patent Number: 5,959,465
[45] Date of Patent: *Sep. 28, 1999

[54] FAST NOR-NOR PLA OPERATING FROM A SINGLE-PHASE CLOCK

[75] Inventor: Robert Beat, Clifton, United Kingdom

[73] Assignee: STMicroelectronics Ltd., Almondsbury, United Kingdom

[ * ] Notice: This patent issued on a continued prosecution application filed under 37 CFR 1.53(d), and is subject to the twenty year patent term provisions of 35 U.S.C. 154(a)(2).

[21] Appl. No.: 08/581,737

[22] Filed: Dec. 29, 1995

[30] Foreign Application Priority Data

Dec. 29, 1994 [GB] United Kingdom .................... 9426335

[51] Int. Cl.$^6$ ................................................. H03K 19/177
[52] U.S. Cl. ................................ 326/39; 326/45; 326/93; 326/98
[58] Field of Search .......................... 326/39, 41, 44–45, 326/49–50, 93, 95, 98

[56] References Cited

U.S. PATENT DOCUMENTS

| 4,751,407 | 6/1988 | Powell . | |
|---|---|---|---|
| 4,760,290 | 7/1988 | Martinez . | |
| 4,769,562 | 9/1988 | Ghisio | 326/98 |
| 4,894,564 | 1/1990 | Sakashita et al. | 326/98 |
| 5,083,047 | 1/1992 | Horie et al. | 326/98 |
| 5,101,122 | 3/1992 | Shinonara | 326/98 |

FOREIGN PATENT DOCUMENTS

| 0 251 930 A3 | 7/1988 | European Pat. Off. . |
| 0 311 046 A3 | 4/1989 | European Pat. Off. . |

*Primary Examiner*—Jon Santamauro
*Attorney, Agent, or Firm*—David V. Carlson; Kevin S. Ross; Seed and Berry LLP

[57] ABSTRACT

A method is provided for operating a programmable logic array in an integrated circuit. Each stage of the circuit is enabled only during the time necessary for that stage to propagate an incoming signal. Enable signals are generated for the stages of the circuit, using a dummy circuit which replicates elements of the circuit in dimension, orientation and connectivity. These elements provide a delay path, such that an input signal applied coincidentally to the programmable logic array circuit and the dummy circuit produces outputs of the dummy circuit which define times for applying and removing the enable signals from stages of the programmable logic array circuit.

20 Claims, 13 Drawing Sheets

FAST NOR-NOR PLA OPERATING FROM A SINGLE-PHASE CLOCK

TECHNICAL FIELD

The present invention is in the field of controlling a programmable logic array in an integrated circuit, and in particular, controlling PLA used in memory devices such as flash EPROM memory devices.

BACKGROUND OF THE INVENTION

FIG. 1 shows circuitry for controlling a flash memory cell. Memory cell 2 comprises a single transistor 4, having a control gate CG and a floating gate FG, a source S and a drain D. The source S may be connected either to a ground voltage VGND, or to a programming voltage VPP, by source voltage switch 8, according to a signal applied to an erase control input 10. The drain D of transistor 4 is connected to a bitline 12, which may be connected either to a sense amplifier circuit 16 or to a programmable load circuit 18 by a bitline switch 14, according to a select input 20. The programmable load circuit 18 is controlled by load control signals 22. The sense amplifier circuit 16 provides an output to a data line 24. The control gate of transistor 4 is connected through word line 26 to a gate voltage switch 28. This permits the control gate CG to be connected to the ground voltage VGND, the programming voltage VPP or a supply voltage Vcc, according to control signals applied to program and erase control inputs 30, 10 respectively. Vcc is 5V for a memory device operating with a 5V supply, and about 5V for a memory device operating with a 3V supply. VPP may be approximately 12V.

The flash memory cell 2 has three modes of operation.

In program mode, a 0 is written to the cell. The control gate CG is connected to the program voltage VPP. The source S is connected to the ground voltage VGND and drain D is connected to the programmable load circuit 18, programmed to place the drain at about 5V. Thus, the floating gate FG is negatively charged, making the transistor less conductive for a given control gate voltage.

In erase mode, a 1 is written into the cell. The control gate CG is connected to ground voltage VGND, the source S is connected to program voltage VPP. The bitline switch 14 is set to allow bitline 12 to float at around 1V. The charge on FG is reduced, making the cell more conductive. After a sufficient time, a 1 is considered written into the cell.

In read mode, voltages are applied to transistor 4 such that a relatively low current will flow when a 0 has been written into the cell, and a relatively high current will flow when a 1 has been written into the cell. The contents of each memory cell may thus be determined. The control gate CG and the wordline 26 are connected to the supply voltage Vcc. The source is connected to ground VGND. Bitline 12 is connected to the sense amplifier circuit 16, which provides a bias of around 1V. The amount of current flowing through the transistor 4 depends on its programmed or erased state. The sense amplifier 16 detects the level of the current and places the dataline 24 in a logic state indicative of the state of the cell 2.

In a flash memory device, many cells such as that shown in FIG. 1 are connected and provided with addressing circuitry. Each cell, however, functions as described above, in its three possible states. Commands are provided to the memory device to control its functionality. The circuitry required to enact the control functions is included in the same integrated circuit as the memory cells.

Command words are loaded by use of input/output (I/O) terminals of the flash memory device, loading of command words being controlled by a clock signal applied to a write enable or chip enable terminal. The command present on the I/O terminals must be latched internally on the next rising edge of an applied clock signal. The command may require latching of other data present on device terminals, and thus must be interpreted and acted upon before the following falling edge of the input clock.

The use of relatively high voltages and fast digital switching speeds means that a flash memory circuit is a very noisy environment.

Flash memory devices interpret and validate the command words using logic circuitry known as a command user interface, advantageously realized by use of a state machine. In this context, a state machine is a logic circuit with a finite number of possible states, having a number of inputs and outputs; some of the inputs being connected to some or all of the outputs. In such a circuit, a current state is defined by current values of the inputs connected to outputs of the state machine. A clock signal is usually applied and the state machine changes state at each clock cycle, according to signals applied to the inputs.

The logic circuitry required within a state machine may be implemented in a number of ways. Preferably, a programmable logic array (PLA) implementation is used. PLAs have the advantages that they are usually of a compact structure; their generation and circuit layout may easily be automated by use of a suitably programmed computer; the operation of an integrated circuit PLA may be modified, or 'programmed', at the fabrication stage of the integrated circuits by changes in one or two masks.

A PLA is generally composed of two logic planes, an input plane and an output plane. Each plane receives inputs which are applied to gate terminals of transistors within the logic plane, and provides outputs to output nodes. The inputs to the input plane are the inputs to the PLA. The outputs of the input plane are intermediate nodes. The inputs to the output plane are connected to the intermediate nodes. The outputs of the output plane are the outputs of the PLA.

The input plane may provide an AND function, and the output plane may provide an OR function. Alternatively, both planes may provide a NOR function. These functions are defined by the type and connectivity of the transistors used and the signals applied to their gates.

The NOR-NOR configuration described has particular advantages in that it is the simplest to implement in CMOS logic. NOR stages have a number of transistors equal to the number of inputs connected in parallel. Addition of further parallel transistors for accommodating further inputs does not affect the operating speed of the stage.

FIG. 2 shows a circuit diagram of a PLA using static pull-ups both on its input plane 40 and its output plane 42. Both the input plane and the output plane have a NOR logic function. Input signals INA, INB, INC are applied to the gates of N-channel transistors 50, 52; 54, 56; 58, respectively. Each of the transistors has its source grounded and its drain connected to a first terminal of an intermediate node pull-up resistor 59, 60, 62, through intermediate nodes 66, 68, 70, respectively. Each of the intermediate node pull-up resistors has a second terminal connected to a supply line 73.

Each of the intermediate nodes is connected to gate terminals of one or more N-channel transistors 66a, 66b, 68b, 70a. Each of these transistors has its source grounded and its drain connected to an output node 74a, 74b, each of which is respectively connected to a first terminal of a pull-up resistor 76, 80. The pull-up resistors each have a second terminal connected to the voltage supply line 73. The output nodes 74a, 74b supply outputs of the PLA OUTA, OUTB.

The intermediate nodes 66, 68, 70 approach the voltage Vcc of the supply line 73 due to conduction by the intermediate node pull up resistors unless an associated N-channel transistor 50, 52, 54, 56, 58 is conductive due to a high input signal being applied to its gate. The intermediate nodes thus perform NOR functions by comparison with associated input signals.

Similarly, the output nodes provide a NOR function with respect to the associated intermediate node signals. Indicating the intermediate node signals by the node labels, 66=not(INA+INB);
68=not(INB+rNC);
70=notINA.
At the output nodes,
OUTA=not(66+70);
OUTB=not(66+68);
giving:
OUTA=INA.INB+INA.INC;
OUTB=INA.INB+INA.INC+INB.INC.

There are several DC current paths from Vcc to GND, which are continually conductive, and lead to a large current consumption for the circuit taken as a whole.

An alternative method for the implementation of PLAs avoids the large current consumption by static pull-ups. 'Dynamic' pull-ups are used, which perform a pull-up function and hence enable a DC conduction path only when commanded by a pull-up signal.

FIG. 3 shows a modification of the PLA of FIG. 2 wherein the static pull-ups are replaced by dynamic pull-ups. The resistors 59, 60, 62 and 76, 80 are respectively replaced by transistors 92, 94, 96, controlled by a pull-up signal IPU, and transistors 100, 104, controlled by a pull-up signal OPU.

Some time is needed for charging the output nodes to the high voltage Vcc, to be able to provide high outputs OUTA, OUTB. To improve operating speed, the pull-up transistors and pull-up signal OPU are used to charge the output nodes, just before the intermediate node pull-up transistors are rendered conductive, to improve the operating speed of the PLA.

In an initial condition of the PLA, all input signals INA, INB, INC are held in a high state. All input plane transistors are conductive, and the intermediate nodes are held at the ground voltage. All output plane transistors are therefore off. Output node pull-up signal OPU holds pull-up transistors 100, 104 in a conductive state, and the output nodes are thus charged to Vcc. The output nodes 74a, 74b remain charged to the voltage of supply line 73, as none of the associated N-channel transistors 66a, 70a; 66b, 68b is in a conductive state.

As soon as an input is ready for evaluation, a low signal may be applied to some of the inputs of the PLA, rendering some of the input plane transistors non-conductive. The output node pull-up signal OPU becomes inactive. The intermediate nodes 66, 68, 70, approach the voltage Vcc of the supply line 73 unless an associated N-channel transistor 50, 52, 54, 56, 58 is still held in a conductive state due to a high input signal being applied to its gate.

Any high intermediate node signal applied to gates of output plane transistors will cause the associated output node 74a, 74b to become discharged. The charged or uncharged state of the output nodes is reflected by high or low voltages at outputs OUTA, OUTB.

Inputs to the PLA are usually arranged so that both the positive and inverted values of an input signal INA, notINA are applied, to separate inputs of the PLA.

Output signals are usually buffered and stored in temporary storage devices, such as master/slave D-type latches, driven by two phase clock signals such that when the latch is clocked, the outputs of the PLA are stored before the new feedback value is output and is passed back to the inputs of the PLA.

FIG. 4 illustrates an output latch of known type. An output signal OUTA is connected to drain terminal of P-channel transistor 112 and an input of an inverter 114. The source terminal of transistor 112 is connected to supply voltage Vcc. An output of inverter 114 is connected both to a gate terminal of transistor 112 and to an input of pass gate 116. Gate terminals of passgate 116 are connected to clock signal CLK1 and its inverse, notCLK1. An output of pass gate 116 is connected to an input of a latch 122 which comprises two inverters connected in inverse parallel, and further connected to reset circuitry 126. An output of latch 122 is connected both to an input of inverter 132 and an input of pass gate 134. The output of pass gate 134 provides an output signal notLOUT. The output of inverter 132 provides another output signal, LOUT. The gate terminals of passgate 134 are connected to clock signals CLK2 and notCLK2. The reset circuitry 126 is connected to receive a reset signal RST and a reset polarity input notR1, and receives supply Vcc and ground GND voltages.

This output latch works as follows. The latch 122 holds a value at its output, and the inverse of this value at the input. The output of the latch may be reset to 1 by applying RST=1 and notR1=1. It may be reset to 0 by applying RST=1 and notR1=0.

Once the output nodes have been precharged by the output node pull-up transistors 100, 104 controlled by signal OPU, the output of the inverter 114 is 0. Transistor 112 is a resistive channel device, and acts as a keeper. It is rendered sufficiently conductive by the low output of inverter 114 to hold the output node charged and to compensate for any current leakage paths which would tend to discharge the output node. The output node thus retains its precharged state, even after the output node pull-up transistors of the PLA have been turned off. This avoids the need to leave the output node in a floating state, since the high noise levels present in a flash memory device could easily prompt the discharge of such floating nodes.

If the output node OUTA is pulled low during the evaluation of the PLA, a high voltage is applied to the gate of transistor 112, and node OUTA is pulled fully to ground, with no steady state DC current. The output of the inverter 114 is passed by passgate 116 to the input of latch 122, when the clock signal CLK1 is high. The output of latch 122 is inverted by, and is available at the output (LOUT) of, inverter 132. The output of latch 122 is passed to the output notLOUT by passgate 134 when CLK2=1. The output node OUTA is again precharged during the next active (low) period of signal OPU. The output of inverter 114 thus returns to a low value and keeper 112 is re-activated.

To propagate a signal from the output node OUTA to the output notLOUT of the latch requires a high level firstly on CLK1 then CLK2. The two clocks should not overlap, otherwise any spurious signals on OUTA would be transmitted to notLOUT. The output latch thus transmits the inverse of OUTA to LOUT two inverter delays after a rising edge of CLK1, and to notLOUT after rising edges on both CLK1 and CLK2 (in that order).

Preferably, the input signals to the PLA are applied by an input latch and driver circuit. Such a circuit functions to apply a low signal to either a positive or inverted signal input INA, notINA, as appropriate to the polarity of the input signal IN, at a falling edge of a clock signal MASCLK.

FIG. 5 shows a known implementation of an input driver. It comprises an input latch 139 and an input driver 140. An input signal IN is applied to an input of an inverter 141. The output of inverter 141 is connected to an input terminal of pass gate 142. The output of pass gate 142 provides a signal to an input of latch 148, and to a drain terminal of P-channel transistor 150. The latch 148 is composed of two inverse parallel connected inverters. The source of transistor 150 is connected to the supply voltage Vcc 73. The gate terminal of transistor 150 is connected to an active-low reset to zero signal notR0. The output of latch 148 is connected to an input of inverter 151, whose output provides the input latch signal notN_EN. This is the latched value of IN, as at the previous falling edge of MASCLK.

Within the input driver 140, two passgates 152, 154 receive notN_EN on the gates of the N-channel transistor and the P-channel transistor respectively. The signal notN_EN is inverted to N_EN by inverter 156 to supply the gates of the P-channel transistor of passgate 152 and the N-channel transistor of passgate 154. The intermediate node pull-up signal IPU is applied to the inputs of passgates 152, 154. The outputs of these passgates are signals INA, notINA respectively. These two output signals are each connected to a drain terminal of a P-channel transistor 160, 162 respectively. The source terminals of these P-channel transistors are connected to supply voltage Vcc 73, and gate terminals are connected to notN_EN and N_EN respectively.

The input driver of FIG. 5 functions as follows. Depending on the value of notN_EN, either passgate 152 or passgate 154 is conducting. For the non-conductive passgate, the associated P-channel transistor 160, 162 is conductive. One of the two outputs INA, notINA will thus have the value of the applied IPU signal; the other will be held high by transistor 160 or 162. While the IPU signal is inactive (high), both INA and notINA are high. When IPU becomes active (low), one of the outputs INA, notINA will become low also, for the duration of the low level of IPU. The reset to zero signal R0 is used to initially place the latch in its zero output state, hence setting notN_EN high, and rendering passgate 152 conducting.

The signal IN is buffered and inverted by inverter 141, and transmitted by passgate 142 when MASCLK is high. Provided that signal notR0 is inactive, latch 148 stores the value of IN at its output. The output of latch 148 is inverted by inverter 151 to become signal notN_EN, the output of the input latch.

The inputs to the PLA are all held high at all times other than during the evaluation of the input plane. This ensures that all input plane transistors are conductive, the intermediate nodes are held at the ground voltage, the output plane transistors are non-conductive, and the output nodes retain their charged state. The evaluation of the input plane takes place while the intermediate node pull-up signal is active (low). Thus, by defining one of INA, notINA as being high, and the other as being equal to IPU, a low input signal is only applied to the PLA during the active phase of IPU. This low is applied to INA if IN=0, and to notINA if IN=1. INA and notINA are only the inverse of each other during the period of evaluation of the input plane.

FIG. 6 shows a block diagram of the prior art PLA circuit as described above. The input latch A2 latches the value of the input signal IN on the falling edge of MASCLK. The output notN_EN is this latched input value.

The input driver A4 applies the input signals INA, notINA to the input plane when the IPU signal is active (low), according to the value of notN_EN.

The input plane A6 evaluates the input signals INA, notINA while IPU is low, and produces levels at the intermediate node A8, as functions of the input signals.

When OPU becomes active (low), the output plane A10 evaluates the intermediate node levels, and produces levels OUTA which are functions of the intermediate node levels. These levels OUTA are admitted to output latch A12 when clock signal CLK1 is active (high), and transmitted to the PLA output when clock CLK2 is high.

Logic arrangements other than NOR-NOR may be used in the design of PLAs. However, both the AND-OR and the related NAND-NOT-NOR arrangement are more complex, requiring many additional transistors. In particular, the NAND-NOT-NOR arrangement has a NAND stage at its inputs, which is relatively slow, and introduces a significant delay, particularly with a PLA having a large number of inputs. The inverter needed in this arrangement, between the input and output planes, introduces another delay and increases the semiconductor area required to implement such a PLA. The currently described PLA notably does not have any buffers or inverters at the intermediate nodes, this speeding up the operation of the circuit. During the operating cycle of such a PLA, some nodes are charged and left floating. This is particularly undesirable in the application of a flash memory device, as high voltages present on a flash memory chip may cause hot carrier conduction and damage, and may lead to the discharge of the floating node, and hence errors in the PLA output.

Unpublished European patent application No. 94830072.8, which is not admitted to be prior art, to the current application suggests the use of a dummy PLA circuit associated with a PLA circuit, but explicitly excludes NOR-NOR PLA circuits as being not viable. It provides a timing circuit for use with a NAND-NOT-NOR PLA for use in flash memories.

U.S. Pat. No. 4,760,290 describes a programmable logic array with an incorporated delay circuit, allowing timing pulses to be generated. This circuit requires at least two clock edges to evaluate the PLA, which slows operation when compared to a circuit operating on a single clock edge. The delay circuitry is integrated into the PLA arrays, so a separate delay circuit is necessary for each PLA to be controlled. The operation of the circuit according to this U.S. patent relies on the use of floating nodes to store charges representing information. This is not acceptable in high voltage, high noise environments, where noise signals induce discharging of such floating nodes. The circuit described also operates from an external clock, and cannot react quickly to asynchronously applied signals. The following clock transition must be awaited, twice in this circuit, which significantly slows operation of the circuit.

The command user interface in a flash memory device requires that the state machine operates from a single-phase clock. A command is latched on a single rising edge and must be interpreted and acted upon before the next rising edge. The falling edge is used in some commands to latch the input address. The output of the PLA controls whether the address is going to be latched. Therefore this output must be present before the next falling edge if the chip is to know whether or not to latch an address. The minimum time between falling edges of a clock cycle used for flash memory devices is typically between 20 and 40 ns. The outputs of the command user interface must therefore be valid within this time.

As described above, NOR-NOR PLA circuits require that pull-up signals are active at the correct times. The known timing methods require the use of two clock signals IPU, OPU to turn on pull-up transistors only when they are required for the propagation of signals through the PLA, output latches being provided to retain the output level once the pull-up signal becomes inactive. Buffers may also be provided at the intermediate nodes for storage of their values. This method and circuit has the disadvantage that two clock phases IPU, OPU are required to operate the circuit. Each clock is active for a short part of each cycle, and each clock is generated by a monostable, triggered from either the rising or falling edge of a master clock signal. This is not acceptable in applications which require input data to be latched on one edge of a clock signal and the output to be available before the next edge of the clock cycle. In such applications, static pull-up PLAs are used for high speed of operation, but consume a large amount of current.

SUMMARY OF THE INVENTION

An object of the current invention is to provide a NOR-NOR PLA with dynamic pull-ups operating from a clock edge.

Another object of the current invention is to provide a PLA having a fast evaluation time, from the application of input signals to the provision of output signals.

Another object of the current invention is to provide a fast PLA with dynamic pull-ups, wherein no nodes are left floating.

Another object of the current invention is to provide a PLA fulfilling the aforementioned objects, while consuming the minimum of current.

Another object of the current invention is to provide a timing circuit to control the operation of one or more PLA circuits.

These, and other objects, are achieved by providing a circuit and method of operating a programmable logic array in an integrated circuit, containing several stages, the clock signals necessary for the operation of each stage being derived from a single clock signal, by applying this clock signal to a dummy of the PLA circuit, and deriving clock signals from the propagation delays of a signal through the dummy circuit.

The dummy PLA circuit replicates the PLA circuit in dimension and orientation, with delay elements included in the dummy circuit to replicate the propagation delay in the PLA circuit. A transition of a clock signal is applied coincidentally to the inputs of input drivers of the dummy circuit and the programmable logic array to produce outputs which define the times for applying and removing the enable signals from each stage of the programmable logic array integrated circuit.

Particularly, the circuit may include the stages of input drivers, an input array, an output array and output latches, receiving enable signals which are generated by a dummy programmable logic array circuit which contains an input driver emulator, an input plane emulator, an output plane emulator and an output latch emulator stages, each of which reproduces worst case delays to be found in the programmable logic array circuit. The arrival of the transition at each stage of the dummy programmable logic array is used to derive the enable signals to the PLA circuit.

A circuit is provided for use with a programmable logic array comprising delay circuitry which replicates, in dimension, orientation and interconnection, circuitry contained within the programmable logic array. The delay circuitry is designed to impart a delay on an incoming signal at least equal to the delay imparted to an incoming signal by the programmable logic array. The circuit may contain delay circuitry emulating each stage of the programmable logic array, the stages of the programmable logic array being: an input driver, an input plane, an output plane and an output latch; an input signal being applied to the input driver emulator, and the time of arrival of the input signal at other stages being used to generate enable signals to stages of the programmable logic array.

A single circuit comprising delay circuitry may be provided, for timing the operation of a number of PLA circuits in a single integrated circuit.

Particular embodiments of the present invention will be described, by way of example, with reference to the accompanying drawings.

DETAILED DESCRIPTION OF THE INVENTION

According to the current invention, a method and circuit are provided for using a PLA with dynamic pull-up transistors which is evaluated within a single-phase of an applied clock signal, and each enable signal required is produced as early as possible, a dummy circuit replicating the propagation delays of the PLA circuit to determine when each enable signal is to be produced.

To enable the propagation and evaluation of input signals and the provision of output signals from the PLA, the following steps and enable signals are provided for:

1—prior to application of input signals, the output nodes (OUTA) are precharged by the output node pull-up transistors while output pull-up signal OPU is active (low), and held in that state by a keeper circuit;

2—all input nodes (INA, notINA, etc.) are held high by the input drivers to retain the charge on the output nodes;

3—the output node precharge is disabled by a falling edge on OPU;

4—intermediate node pull-up signal becomes active (low), input drivers apply low input signals to the input plane (INA or notINA);

5—input plane is evaluated; intermediate nodes acquire their levels;

6—output nodes are selectively discharged by high values on intermediate nodes causing certain output plane transistors to become conductive; the output plane is evaluated;

7—results (OUTA) of the output plane evaluation are passed into the output latches (CLK1); LOUT becomes available; and 8—the output passgates of the output latches are enabled (CLK2) and the results of the PLA are thus available (notLOUT).

The pull-up signals IPU, OPU are advantageously derived from the same clock, so that OPU is, in fact, the inverse of IPU, labeled notIPU. This means that both IPU, OPU cannot be active at the same time, avoiding any possible through currents which could otherwise result. The absolute minimum delay between one pull-up signal becoming inactive and the other becoming active is also ensured, allowing the fastest possible evaluation of the PLA.

The control clocks IPU, notIPU, CLK1, CLK2 are, according to the invention, derived from propagation delays of a transition of an input signal through a dummy PLA.

Figure 6:
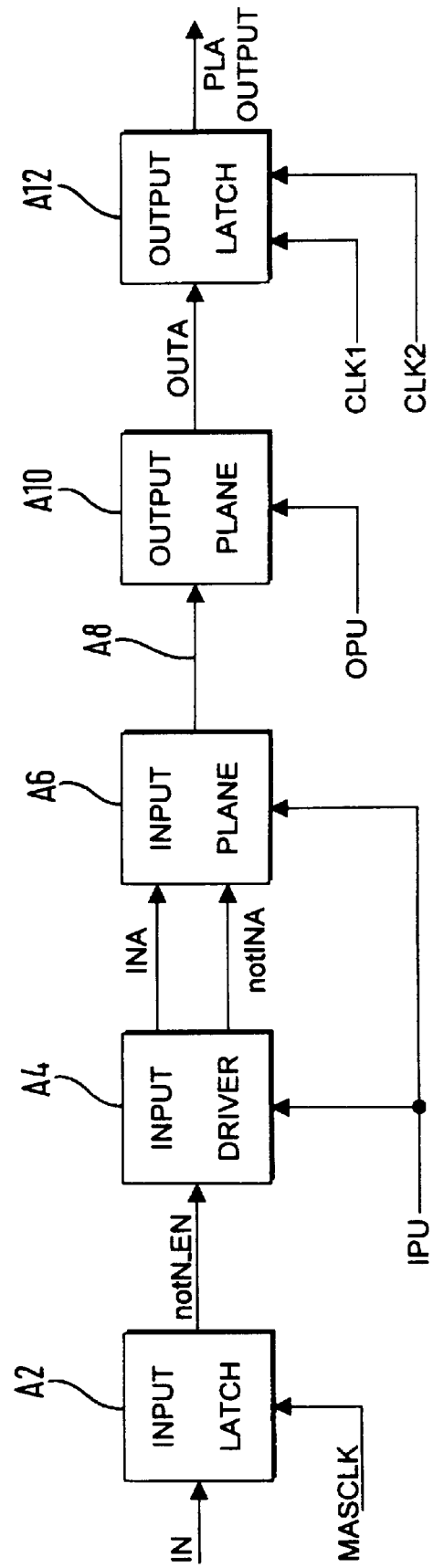
FIG. 6 shows a block diagram of a PLA circuit of the prior art.
Figure 7:
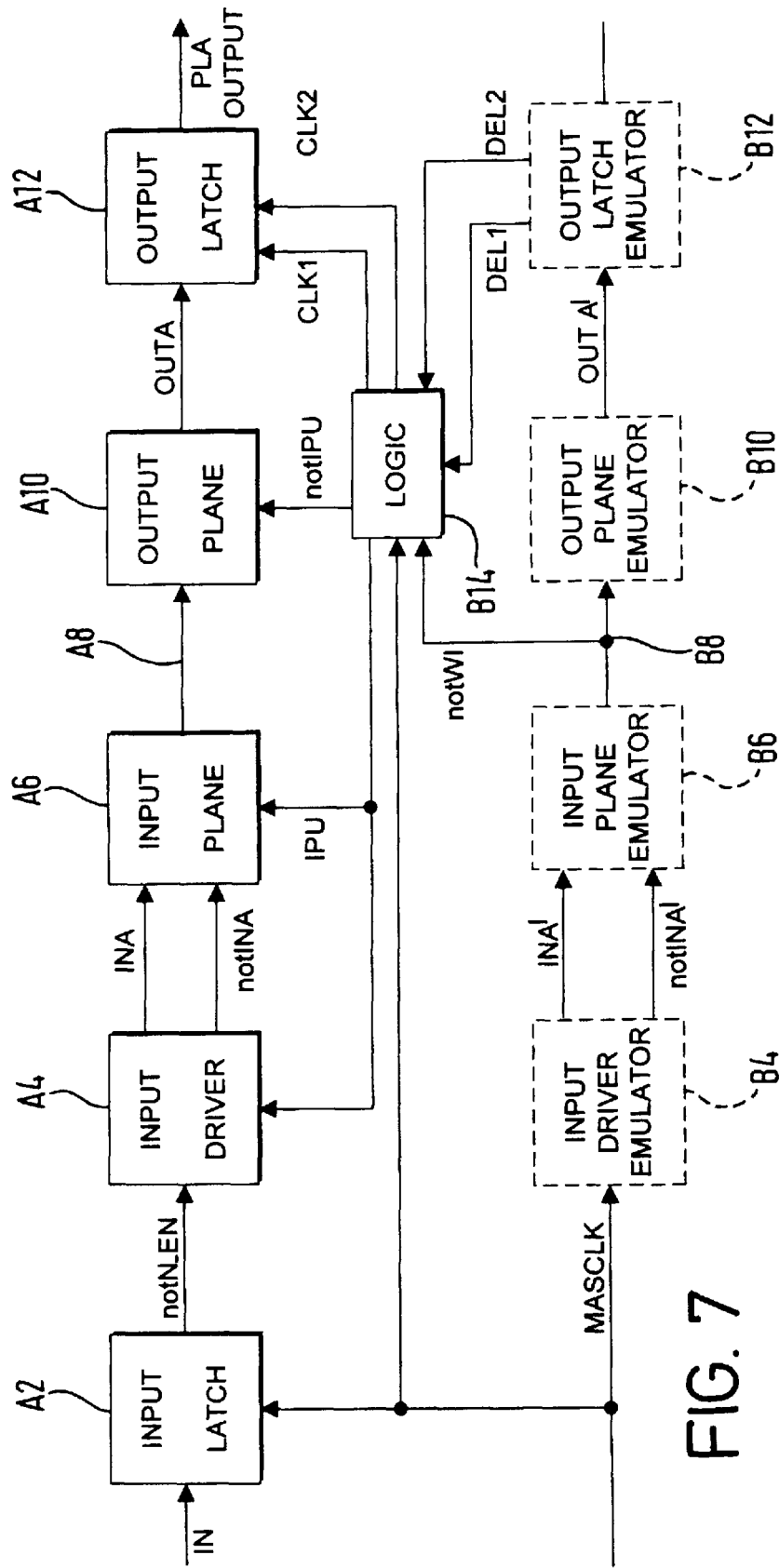
FIG. 7 shows a block diagram of a PLA circuit of the invention.

FIG. 7 shows a block diagram of a circuit according to the invention. The circuit contains the same PLA elements as the circuit of FIG. 6, which carry the same reference labels.

According to the invention, several dummy stages are included, replicating the dimensions and layout of circuitry of the PLA, but in a simplified form.

An input driver emulator B4 replicates the circuitry of the input driver A4, for a single input path. It produces signals INA', notINA' to an input plane emulator B6. The input plane emulator B6 contains a single signal path, replicating worst case delay encountered in the input plane A6. It supplies dummy intermediate node B8, which produces a signal notWI.

Signal notWI is applied to an output plane emulator B10, also with a single signal path, duplicating the worst delay encountered in the output plane A10. It produces an output signal OUTA' to an output latch emulator B12.

The output latch emulator produces two signals, DEL1 and DEL2.

The input driver, input plane and output plane emulators are permanently enabled, by having their enable input tied to ground or Vcc as appropriate; reset circuitry in the emulator stages is disabled in a similar fashion.

The input signal IN to the input latch A2 is latched, and therefore becomes valid, at a falling edge transition of MASCLK. This falling edge transition is taken as a reference for all other timing (enable) signals. The falling edge of MASCLK thus indicates that the input signals to the PLA are ready to be evaluated. It is propagated by the input driver emulator and the input plane emulator. When a transition occurs at the dummy intermediate node B8, signal notWI changes state. The output plane emulator propagates the transition to the output latch emulator B12, which produces a transition on the output signal DEL1, when the transition has been held in the latches, and a transition on a second output signal DEL2 a certain delay later.

Thus, as the falling edge of MASCLK indicates the time at which input values IN are valid, and that each emulator stage introduces a delay equal to the worst case delay in the actual PLA, a transition will occur on notWI at the same time as, or slightly after, the evaluation of the input plane A6; the signal DEL1 will change state slightly after the arrival of signal OUTA at the input passgate of output latch A12, and DEL2 will change state slightly after the signal OUTA has arrived at the output passgate of the output latch A12.

These delay signals notWI, DEL1, DEL2 as well as MASCLK are supplied to a logic circuit B14, which generates the enabling signals IPU, notIPU, CLK1, CLK2, to the stages of the PLA, so as to enable each stage as soon as possible after the input to the stage is available.

Thus, the invention provides a method for replicating the propagation delays of an incoming signal through the various sections of a PLA circuit and using these delays to turn on the intermediate node pull-up signal and the output latch enable signals CLK1, CLK2 only from the time at which the incoming signal arrives at each section, until an output signal has been stored in the output latches. The output node pull-up signal is active at all times other than this time, to ensure that the output mode is precharged. The dummy PLA replicates worst case delays in the actual PLA circuit. If an input signal is applied to an input of the dummy PLA at the same time as it is applied to an input of the actual PLA, one can be sure that, as soon as the signal has propagated to a certain node in the dummy PLA, it will also have propagated to the corresponding node in the actual PLA. The enabling signals are then applied to propagate the input signals through the actual PLA very soon after, but never before, the input signals are available at each relevant stage of the actual PLA.

As the dummy circuit is in parallel with the PLA circuitry, corresponding connections can be made to several PLAs in a single integrated circuit, allowing a single dummy PLA delay circuit to control several PLAs.

As will be appreciated by those of skill in the art, each signal and it's inverse can be used interchangeably in various portions of the circuit as needed. For example, INA' and notINA' can be used in place of each other as the circuit design may dictate. If only one signal is provided, such as notINA', the other can easily be generated by a simple CMOS invertor, as needed.

Figure 5:
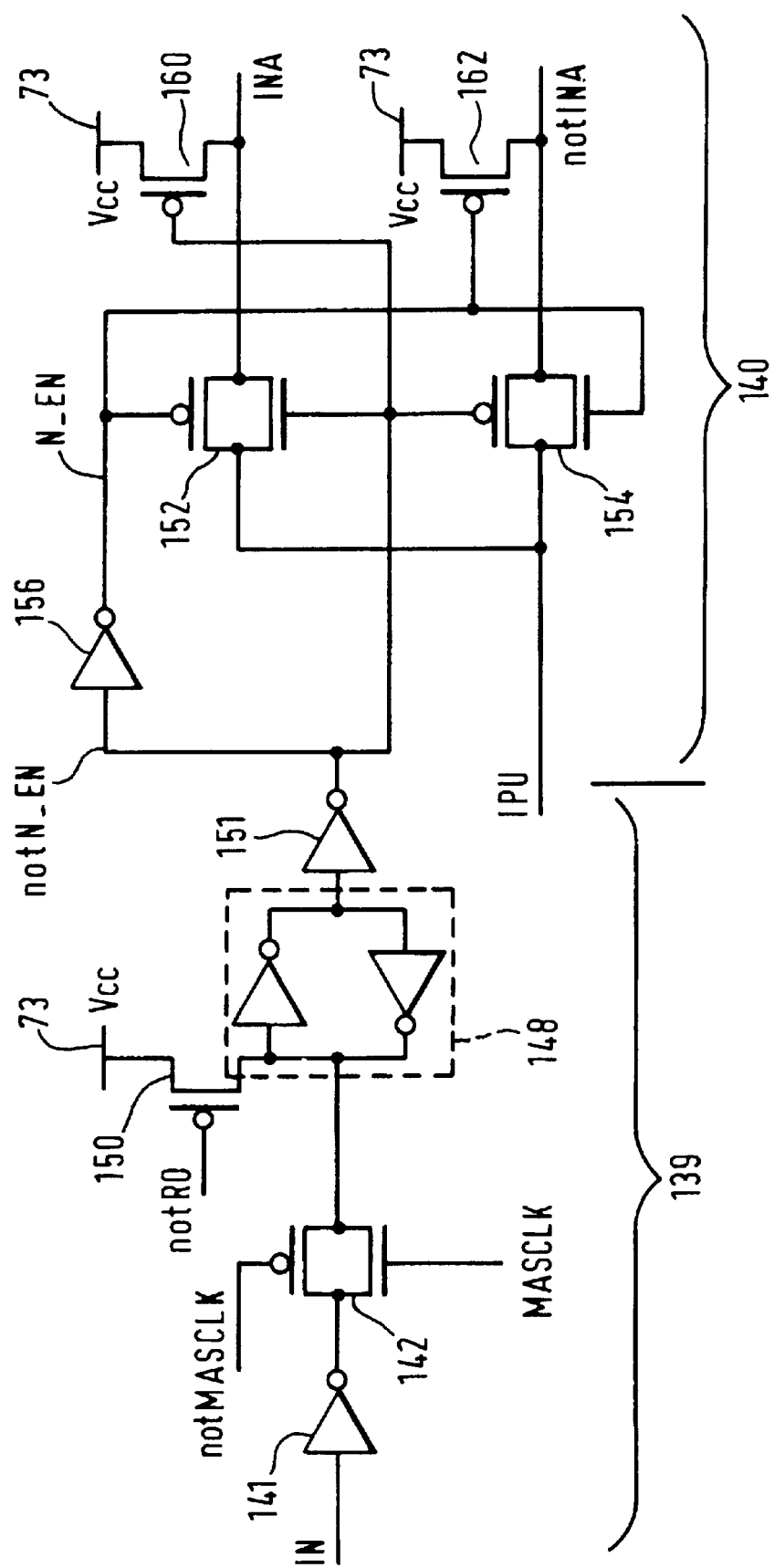
FIG. 5 shows a circuit diagram of an output latch of a known type.
Figure 8:
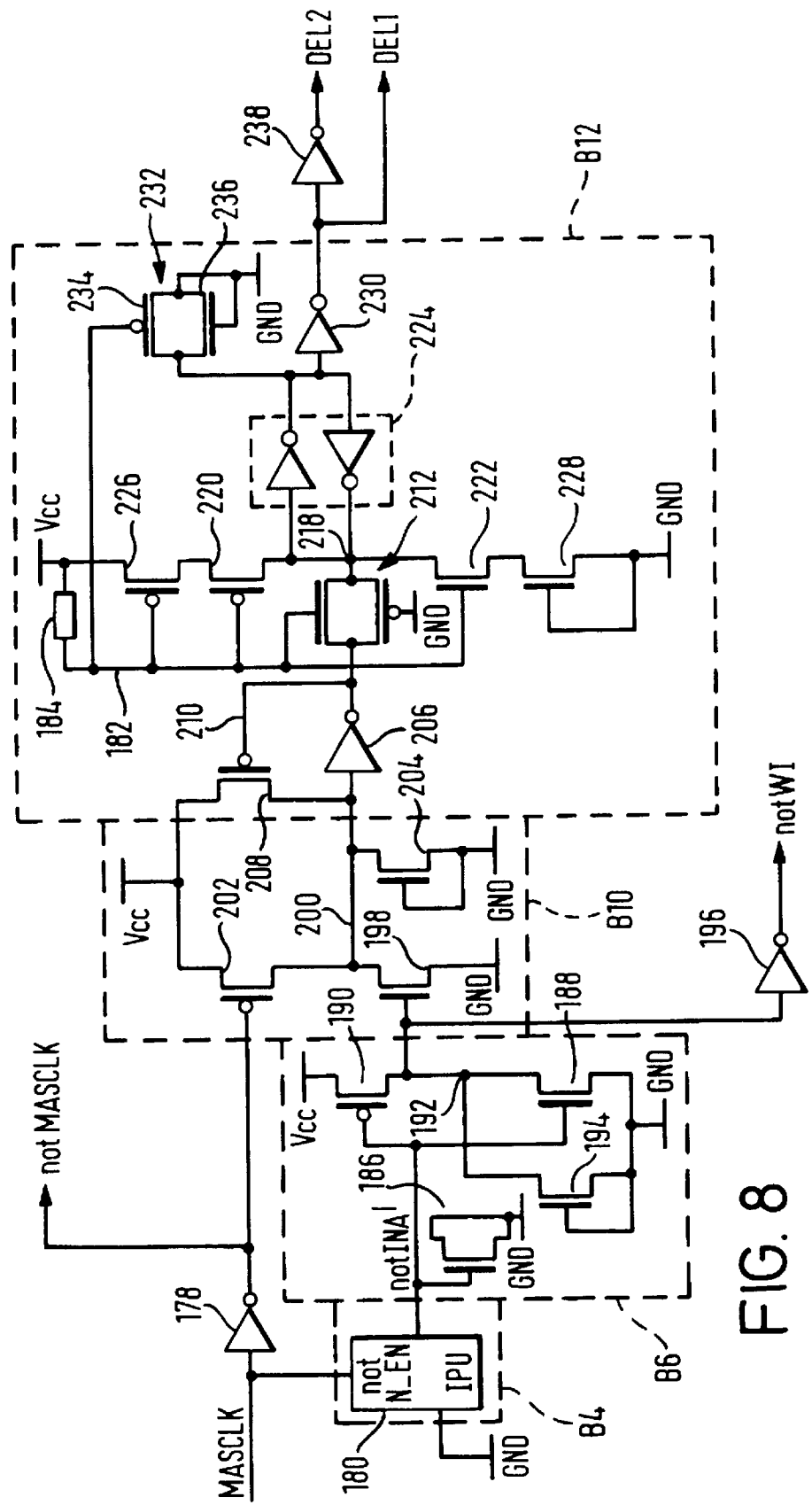
FIG. 8 shows a circuit diagram of a dummy PLA circuit according to the current invention.

FIG. 8 shows a circuit diagram of a dummy PLA according to the present invention. Four stages are provided. Using the same labels as used in FIG. 7, the first stage B4 is the input driver emulator; the second B6 is the input plane emulator; the third B10 is the output plane emulator; the last B12 is the output latch emulator. An inverter 178 is connected to receive input clock signal MASCLK on an input, and to supply the inverse, notMASCLK on an output. MASCLK is also connected to input notN_EN of input driver emulator 180 which is the same as that shown as 140 in FIG. 5, and which is identical to that circuit used in the actual PLA. As an alternative, the input driver emulator B4 is the same circuit as that input driver circuit that is to be emulated, and the design may be different from that shown for FIG. 5. The IPU input of this input driver emulator 180 is connected to the ground voltage. PLA input driver emulator 180 provides an output notINA' to an input of input plane emulator B6. The input notINA' to the input plane emulator is connected to a gate terminal of transistor 186 and to the gates of both an N-channel transistor 188 and a P-channel transistor 190, connected as an inverter, with their drains connected together at node 192, between supply voltage Vcc and ground GND. Node 192 corresponds to the intermediate node of the dummy PLA.

Transistor 186 has both its source and drain terminals grounded, and acts as a capacitive load. This load is designed to equal the total capacitive load of all input transistors connected to the most heavily loaded input driver circuit. In one embodiment, transistor 186 is a single transistor; in an alternative embodiment, transistor 186 is realized by a selected number of transistor gate capacitances in parallel.

A second N-channel transistor 194 has its channel connected in parallel with that of N-channel transistor 188, and its gate connected to a ground. It provides a drain loading on the intermediate node 192 of the dummy PLA, and the value of this drain loading is selected to be equal to that of the loading on the most heavily loaded intermediate node of the actual PLA. The transistors 188, 190 are identical to those used in the input plane of the PLA. Transistor 194 is a single transistor in one embodiment; in an alternative embodiment, transistor 194 is realized by a number of transistors in parallel, their number being equal to the number of transistors on the most heavily loaded input to the PLA, and their dimension and orientation corresponding to that used in the actual PLA.

Node 192 is connected to an input of an inverter 196, whose output supplies the intermediate node timing output signal notWI. This is the output of the input plane emulator and is connected to the input of the output plane emulator B10.

NotWI at node 192 is connected to the gate of N-channel transistor 198, whose source is connected to the ground voltage GND and whose drain is connected to a node 200. A P-channel transistor 202 has its drain connected to node 200, and its source connected to the supply voltage Vcc; its gate is connected to the inverted input clock signal notMASCLK. This represents the pull-up transistor of the output plane. Node 200 is further connected to the drain of an N-channel transistor 204. Gate and source terminals of transistor 204 are connected to the ground voltage GND. This transistor 204 is designed to operate as a drain load, imparting a propagation delay equal to the delay imparted by the most heavily loaded intermediate node. Transistor 198 is a single transistor in one embodiment or, alternatively, may be realized, in practice, by a number of transistors in parallel, their number being equal to the number of transistors on the most heavily loaded input to the PLA, and their dimension and orientation corresponding to that used in the actual PLA. The signal at node 200 is the output of the output plane emulator.

Node 200 is connected to the input of output plane emulator B12, an input of an inverter 206, and the drain of a P-channel transistor 208. The source terminal of transistor 208 is connected to supply voltage Vcc, the gate terminal being connected, at node 210, to an output of inverter 206. This corresponds to keeper 112 and inverter 114 of the output latch of FIG. 4. Node 210 is further connected to an input of pass gate 212. The gate terminals of the P-channel transistor and the N-channel transistor of the pass gate 212 are connected to the ground voltage GND and node 182, respectively. An output of pass gate 212 is connected to a node 218, itself connected to the drain of a P-channel transistor 220, the drain of an N-channel transistor 222 and an input of a latch 224 comprising two inverse-parallel connected inverters.

The gate terminal of P-channel transistor 220 is connected to node 182, and its source terminal is connected to a further P-channel transistor 226, whose gate is connected to node 182, and whose source is connected to supply voltage Vcc.

N-channel transistor 222 has a gate terminal connected to node 182 and a source terminal connected to a drain terminal of an N-channel transistor 228, whose source and gate terminals are both connected to ground voltage GND. Node 182 is connected to Vcc by resistor 184.

P-channel transistor 220 and N-channel transistor 222 are non-conductive and conductive, respectively.

The circuit branch containing transistors 220, 222, 226, 228 replicates a realization of the reset circuitry 126 which is used in the actual PLA circuit. In operation, the reset signal RST would be applied to the gate of 228, the inverse of this signal, notRST would be applied to the gate of 226, and the polarity signal notR1 would be applied to the gates of both 220, 222.

Figure 1:
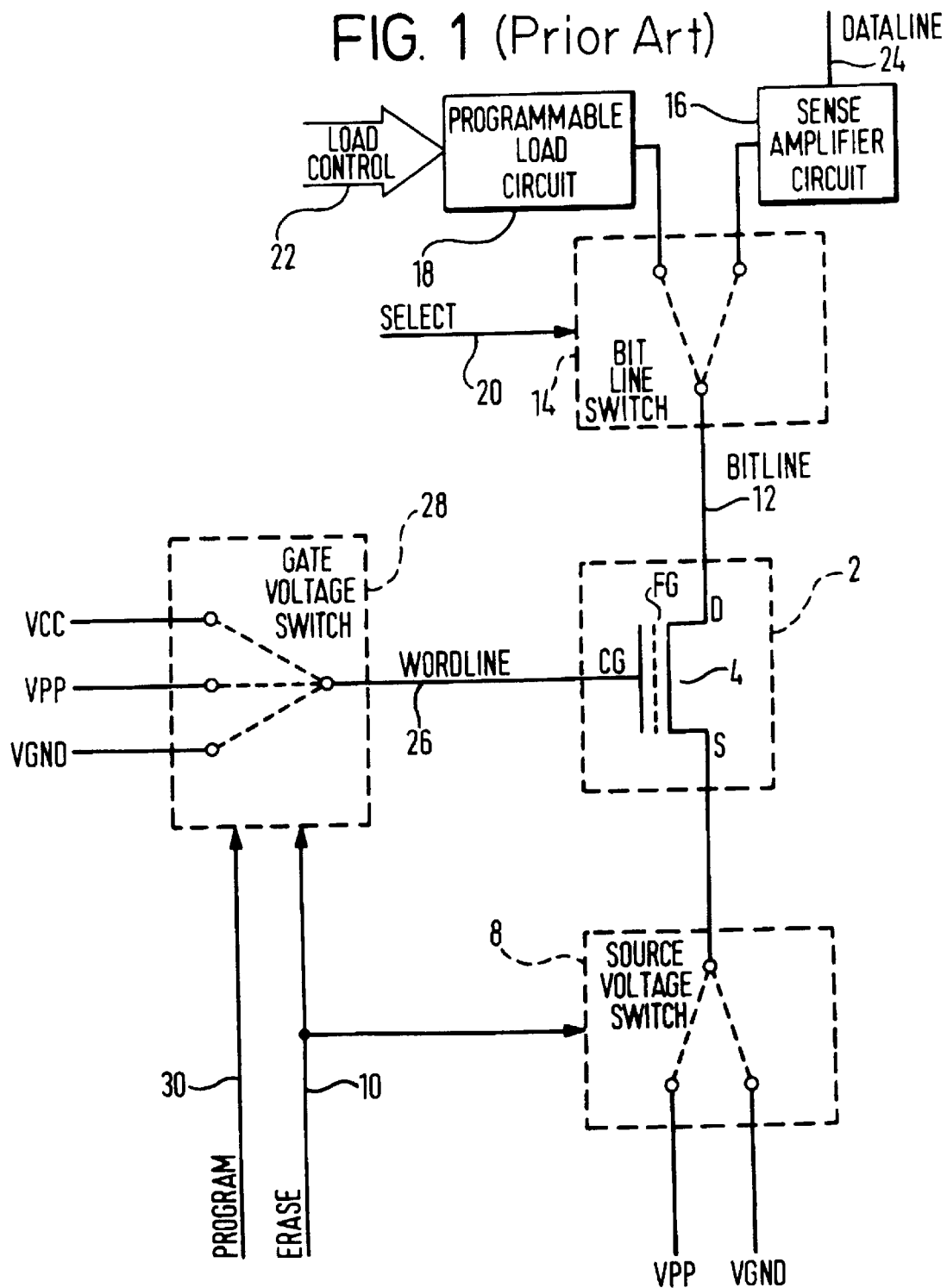
FIG. 1 shows a block diagram of a known flash memory device.
Figure 2:
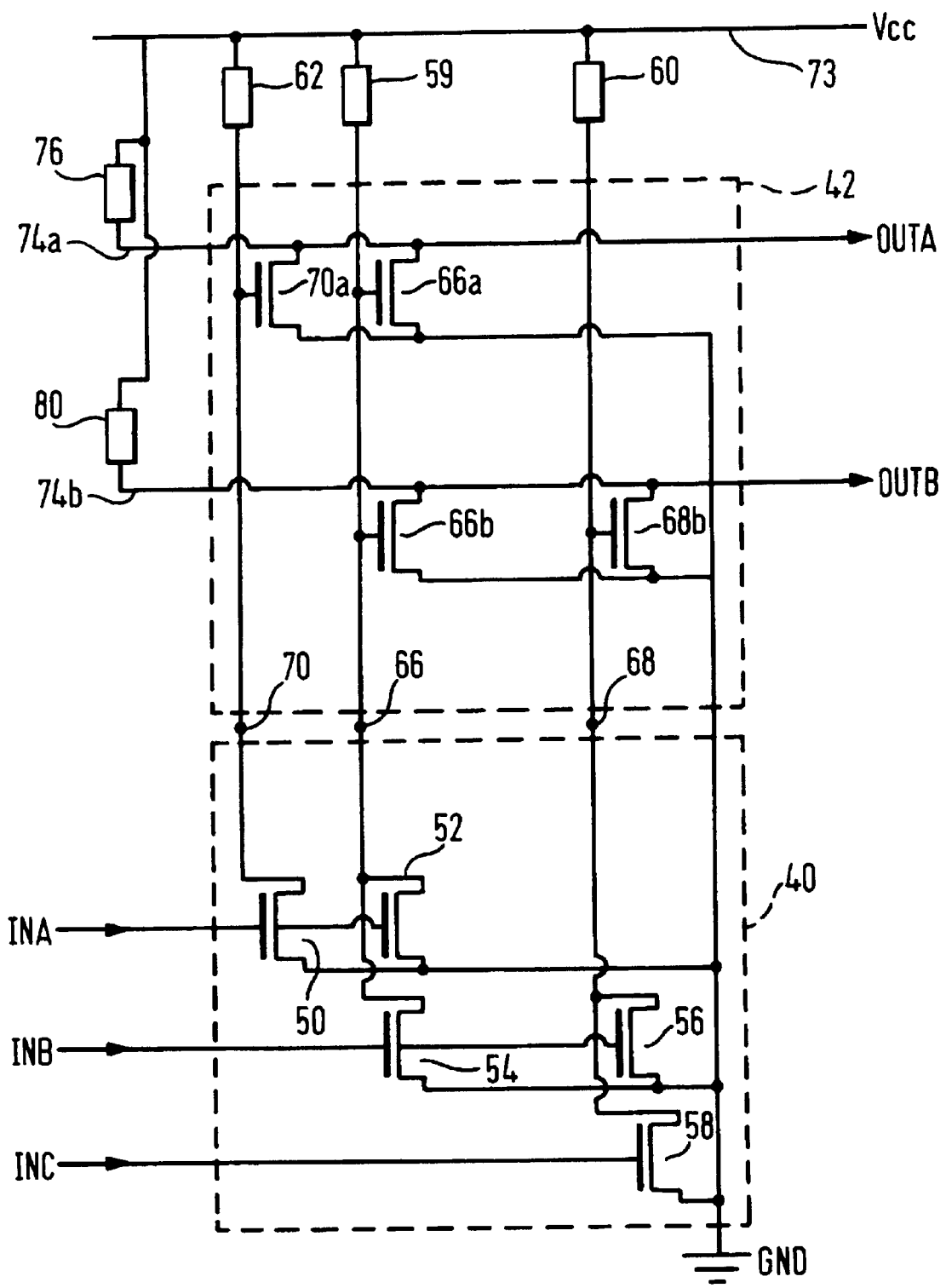
FIG. 2 shows a circuit diagram of a known implementation of a programmable logic array using static pull-up circuitry.
Figure 3:
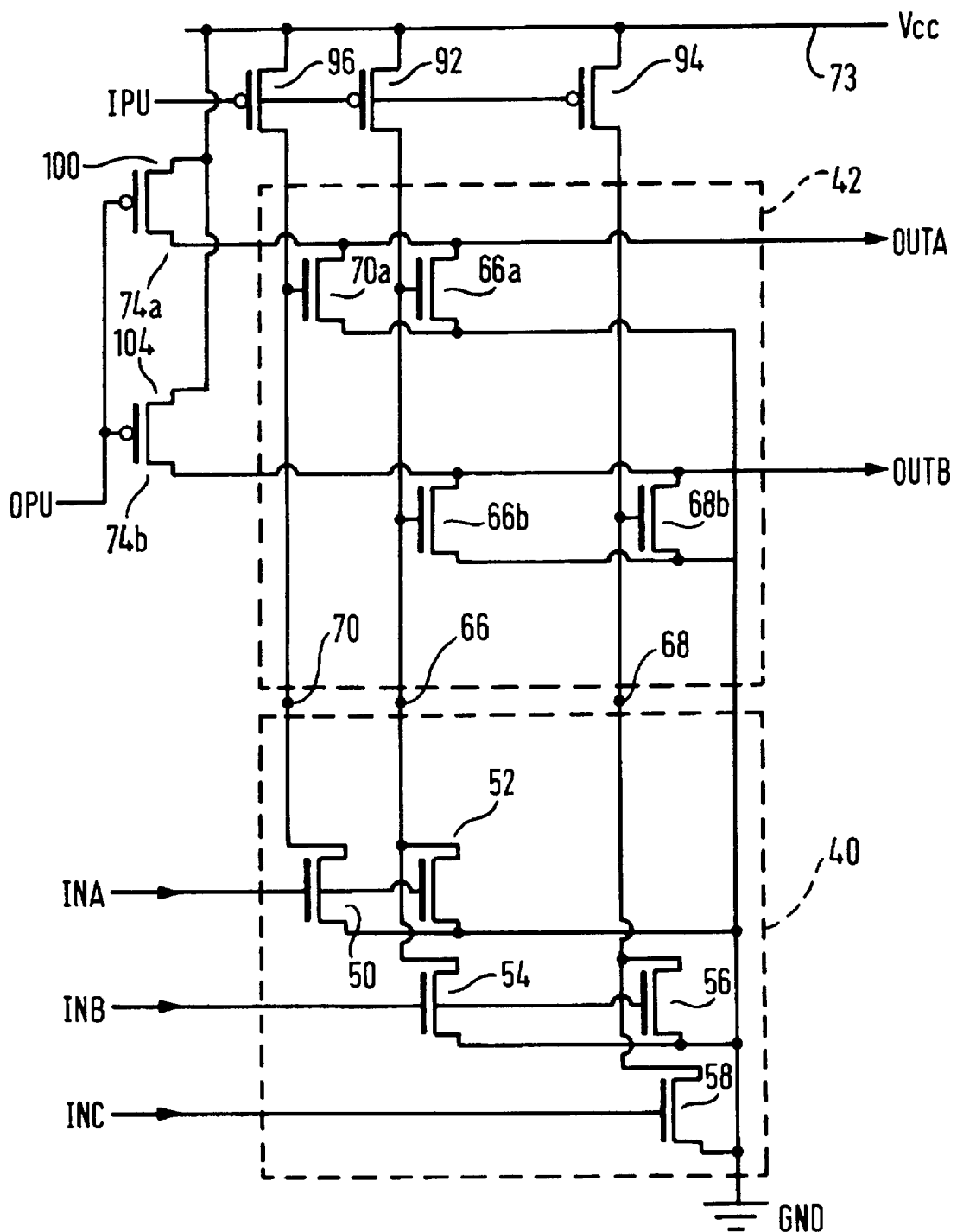
FIG. 3 shows a circuit diagram of a known implementation of a programmable logic array using dynamic pull-up circuitry.
Figure 4:
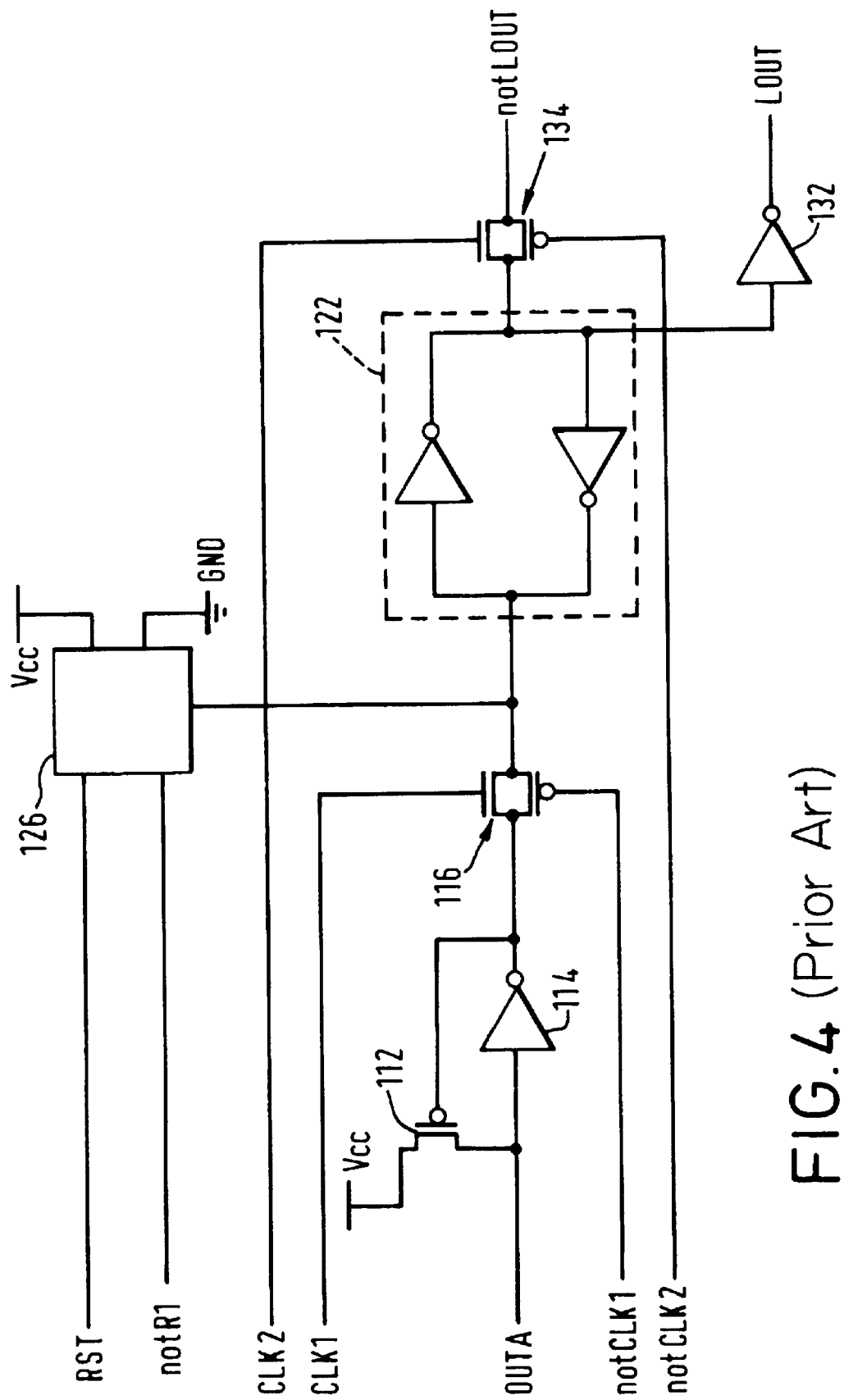
FIG. 4 shows a circuit diagram of an input latch of known type.

This circuitry corresponds to, and is preferably laid out in the same dimensions and the same orientation as, the output latch circuitry of FIG. 4. Alternatively, if a different output latch is used for A12 than that shown in FIG. 4, the emulator circuit is preferably laid out in the same dimensions and orientation as the actual output latch A12 of the PLA being emulated.

The output of the latch 224 is connected both to an input of an inverter 230, and an input of a pass gate 232, comprising P-channel transistor 234 and N-channel transistor 236. The gate terminal of transistor 236 and the output of the passgate 232 are both connected to ground voltage GND; the gate terminal of transistor 234 is connected to node 182.

The output of inverter 230 provides output signal DEL1, and is also connected to an input of inverter 238, whose output provides output signal DEL2. DEL1 thus indicates the time at which an input signal is propagated to the output of the output latches. DEL2 is an inverted, and hence slightly delayed, version of this.

The circuit of FIG. 8 operates so as to simulate worst-case delays through the actual PLA. Input driver emulator 180 has an identical layout to input driver circuits used to supply input signals to the actual PLA circuit. Its IPU input is held high so as to ensure that the output notINA changes state from high to low upon the application of a falling edge of MASCLK to the notN__EN input.

The transistors 188, 194; 198, 204 are designed to delay the incoming signal for a period as long as the maximum delay imparted by input and output planes of the actual PLA.

During operation, all latches are reset by applying appropriate reset signals. A falling edge transition is applied to the MASCLK input of the dummy PLA. This is the clock signal also for the actual PLA and all timing and control signals must be referenced to this transition.

The transition causes the low level on IPU to be supplied to the output notINA', which was previously held at the high level. By comparison with FIG. 5, a high notN__EN causes transistor 162 to be held on, and thus a high value is maintained at notINA. When notN__EN goes low, transistor 162 becomes non-conducting, passgate 154 becomes conducting, and the low value of IPU is passed to notINA'. The transition of notINA' is delayed by the capacitive load 186, representing the input node delay in the actual PLA.

This falling edge transition thus arrives at the gates of transistors 188, 190 with a delay equal to that of the input driver delay of the actual PLA and is then propagated and inverted by the input plane emulator B6 comprising transistors 188, 190, 194. Transistors 188, 190 invert the transition, at node 192, delayed by the capacitance provided by the drain of transistor 194 and the gate of transistor 186. This is designed to have a capacitance equal to that at the input plane node of the actual PLA with the largest number of connected transistors. A delay equivalent to the delay of the most heavily loaded input to the input plane of the actual PLA is thus provided.

The transition arrives at node 192 after a delay, corresponding to the arrival at the intermediate node. The signal notWI derived from this node thus indicates when the inputs in the actual PLA have reached the intermediate node.

The output notWI is a delayed version of the falling edge of clock signal MASCLK, delayed by a delay equal to the worst case intermediate node delay in the actual PLA.

Before the input transition, MASCLK was high, notMASCLK low and P-channel transistors 202, 208 were conductive, with transistor 198 non-conductive.

Following the input transition, transistor 202 is non-conductive state due to a high signal notMASCLK applied to its gate. This replicates the action of the output pull-up transistors precharging the output nodes of the actual PLA. The transition occurring at node 192 brings N-channel transistor 198 into a conductive state, and hence lowers the voltage of node 200, replicating the output node discharging in the actual PLA. This voltage lowering is delayed by the drain capacitance of transistor 204, which is designed to be equal to the total capacitance of the most heavily loaded output node in the actual PLA. The signal transition at node 200 is thus delayed with respect to the input transition by an amount equal to the worst case delay which could be observed at an output node of the output plane of the actual PLA.

The inverter 206 and the transistor 210 replicate the inverter 114 and keeper 112 of the actual output latch, FIG. 4.

The gate capacitance of transistor 198 is designed to be equal to the worst case gate loading on the intermediate node of the actual PLA. Again, this could be formed by several transistors in parallel, each with the same dimensions and orientation as those used in the actual PLA.

Pass gate 212 is permanently conducting, the gate of the P-channel transistor being at the GND voltage, the gate of the N-channel transistor being held at Vcc by resistor 184. The pass gate 212 introduces a propagation delay into the signal path. This propagation delay is designed to be equal to the worst-case propagation delay which could be experienced at the passgate 116 of the output latch, FIG. 4.

A delay is thereby introduced in the transitions occurring at node 218. Latch 224 introduces another propagation delay, and is identical in dimensions and layout to the latch 122 used in the actual PLA output latch circuit. Passgate 232 is non-conductive, as the gate of the N-channel transistor is held at the ground voltage, and the gate of the P-channel transistor is held at Vcc by resistor 184. This passgate serves only as a capacitive load on the input to inverter 230, replicating the effect of passgate 134 in the actual output latch circuit, which is non-conductive while CLK2 is low.

The first output DEL1 of the output latch emulator B12 is thus the output signal resulting from the falling edge of the MASCLK signal, delayed by a time equal to the worst case delay through the PLA to the outputs (LOUT). It indicates that output signals are ready at the output latch pass gates of the actual PLA. The output of inverter 238, DEL2 is the inverse of DEL1, farther delayed by one inverter's propagation delay. DEL2 thus represents the time at which the input transition is available at the output latch output passgate 134.

As described previously, the delay signals notWI, DEL1, DEL2 provided by the dummy PLA circuit are used to generate enable signals for various parts of the actual PLA circuit.

Figure 9:
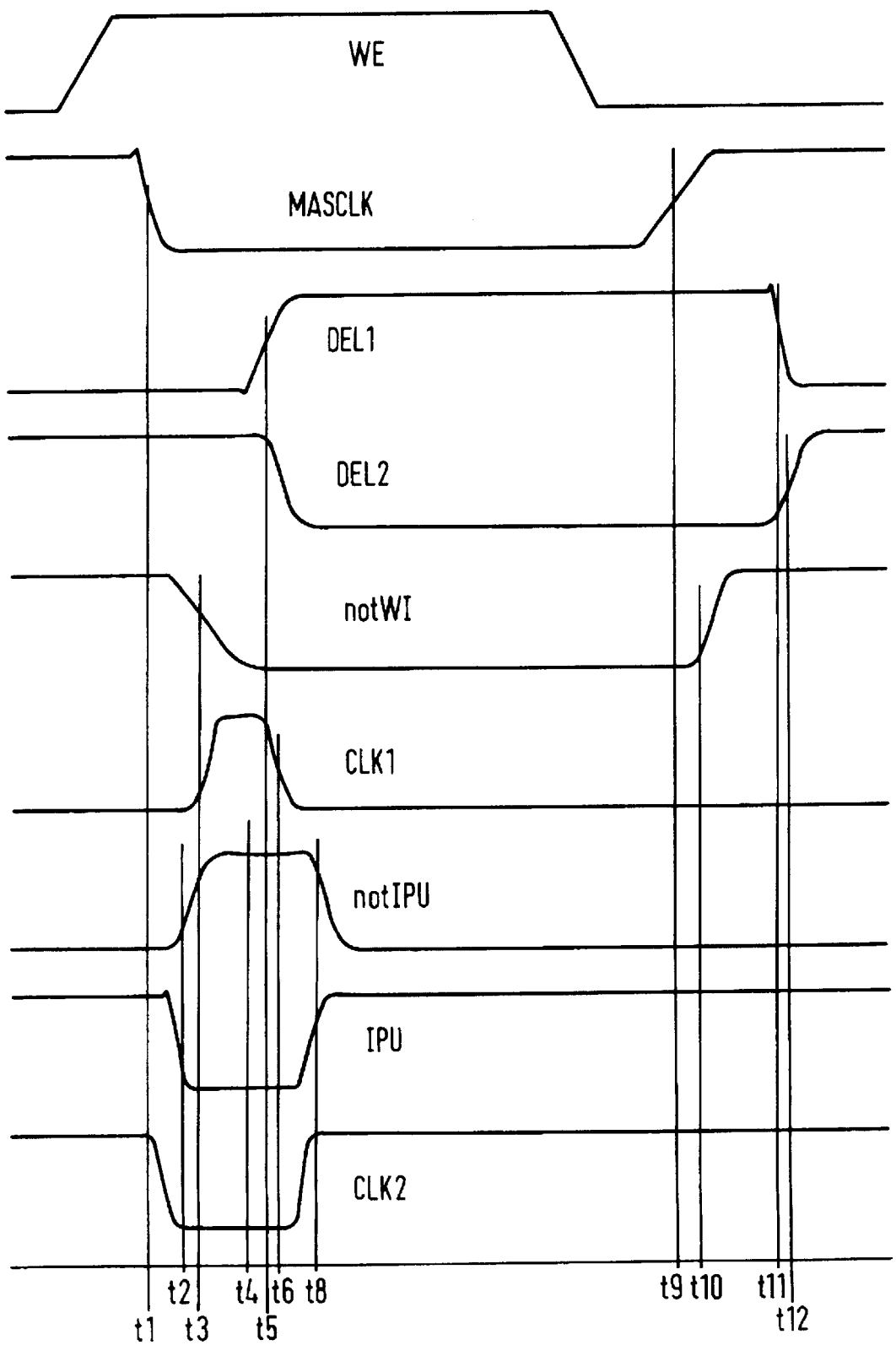
FIG. 9 shows a timing diagram showing the required clock signals to be generated by the circuit of the invention.

FIG. 9 shows a timing diagram illustrating the required generation of enable signals from the delay signals generated as described above. The clock signal MASCLK may be derived from an externally applied signal, such as write enable signal WE.

Four enable signals are required for the propagation of logic levels through the PLA.

Firstly, the intermediate node pull-up enable signal IPU allows inputs to be evaluated by the input plane of the PLA in its active state. This should be active (low) during the whole period of evaluation of the state of the PLA—from the time the falling edge of the clock signal MASCLK arrives, indicating that input values are latched, until output values have been latched into the output latches, as indicated by signal DEL2.

Secondly, the output node pull-up enable signal notIPU is provided by inverting the intermediate node pull-up signal IPU. It is thus active (low) at all times other than the evaluation of the PLA.

Thirdly, an output latch input passgate enable signal CLK1 is required, which defines when the output latch input pass gates 120 should be opened. This needs to be active (high) from the time the outputs begin to be available, which is the time that the intermediate nodes take their value, indicated by signal notWI, until outputs are available, indicated by signal DEL1.

Lastly, the signal CLK2 is required to activate the output latch output pass gate 134. This needs to be valid from the time that the outputs have been latched into output latches, indicated by signal DEL2, until the inputs to the PLA for the next cycle are ready for evaluation. The clock signal CLK2, which is active high, is valid for the whole period of operation of the PLA, except from the time that the falling edge of the clock signal MASCLK arrives, until the new result is ready to be connected to the PLA outputs, as indicated by DEL2. This corresponds to the period of evaluation of the PLA, as defined by the period during which IPU is active. The timing is thus similar to that of IPU, notIPU.

Many PLA circuits may be multiplexed at the outputs of their output latches. In such a case, the multiplexing is done on CLK2, as only one PLA must receive a valid CLK2 signal at a time. When a multiplexed PLA circuit is not selected, CLK2 must be set low, to ensure that the output latch output pass gates are non-conductive. IPU must be set high to ensure that the PLA is held in its initial state, with output nodes in precharge mode; all inputs to the input plane being high, and all precharge transistors 100, 104 being conductive. The output nodes are thus prevented from floating.

The timing of the falling edge of CLK1 is critical. This must not occur until the output levels in the actual PLA have been stored on the output latches. For this reason, DEL1 is used, an inverter delay after the transition has passed through the latch 224, to ensure reliable latching of the output levels in the actual PLA. DEL2 serves only to provide a short delay after this, to ensure that CLK2 becomes active only after the falling edge of CLK1. The two clocks CLK1, CLK2 must not overlap, otherwise any spurious inputs on OUTA would be transmitted immediately to the PLA output notLOUT. From this description, it can be seen that a circuit is shown and described having all timing signals referenced to the falling edge of a single clock, MASCLK. The frequency or duty cycle of this signal has no effect on the delay signals.

When MASCLK is derived from an externally applied signal, such as the write enable signal WE, this is completely asynchronous compared to any on-chip clocks that may be present in the integrated circuit. Two consecutive write enable cycles may be a long time apart, which precludes the use of floating precharged nodes, as these may discharge between consecutive write enable cycles.

Figure 10:
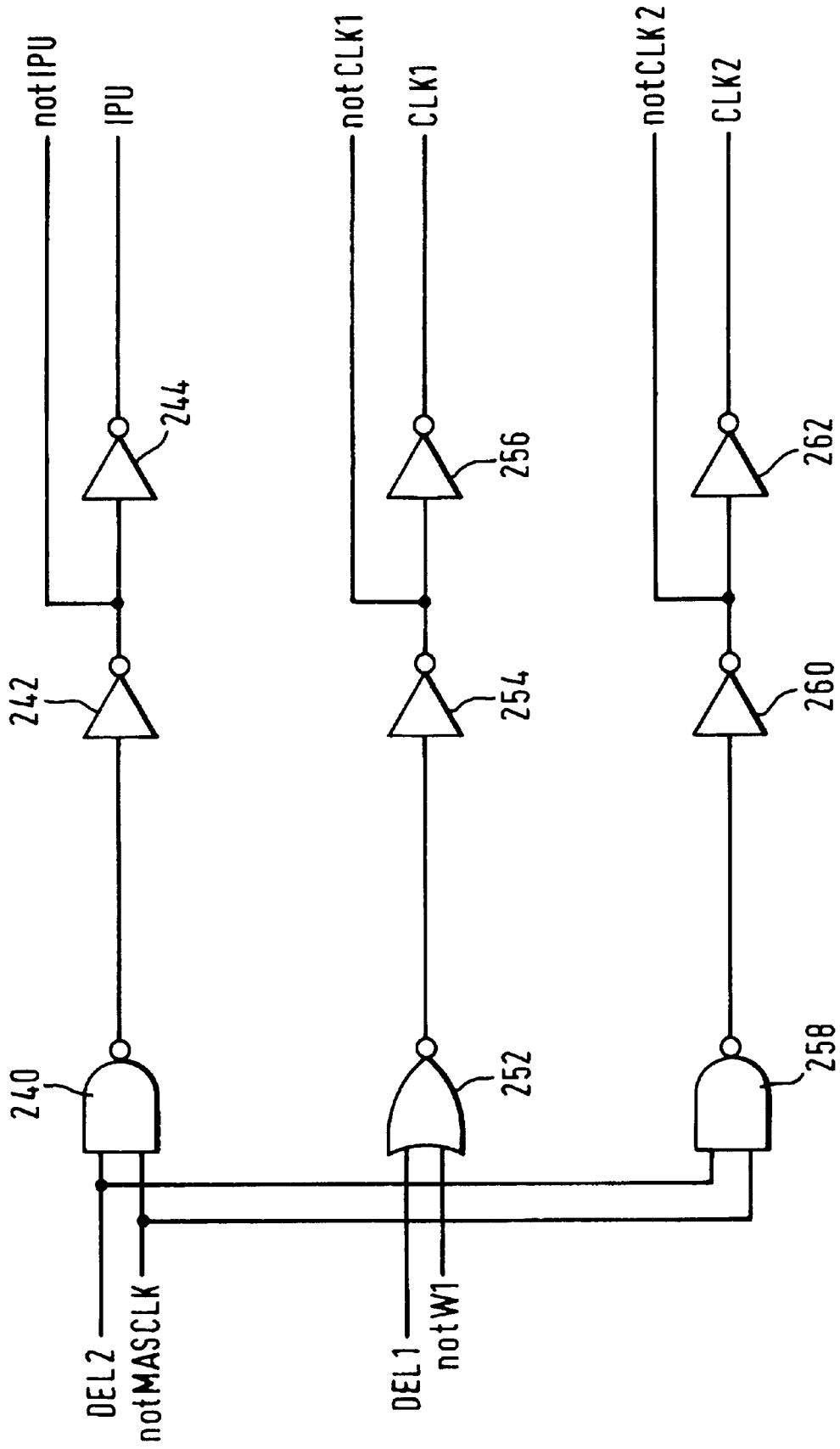
FIG. 10 shows circuitry for use with the circuit of FIG. 8 to generate clock signals.

FIG. 10 shows logic circuitry B14 which may be used to generate the required enable signals from the delay signals described.

NAND gate 240 receives as inputs the signals DEL2 and notMASCLK, and provides an output connected to an input of an inverter 242. FIG. 8 shows inverter 178 as part of logic unit B14 of FIG. 7 to generate to notMASCLK signal. The output of inverter 242 supplies an output notIPU, and an input of inverter 244, which supplies the signal IPU at its output. The output of gate 240 is low only when both DEL2 and notMASCLK are high, i.e., from the moment of application of the input until the latching of the output.

NOR gate 252 receives as inputs the signals DEL1 and notWI, and supplies an output to inverter 254, whose output provides a signal notCLK1 and is also connected to an input of inverter 256, whose output is signal CLK1. This signal is thus active (high) when both DEL1 and notWI are low, i.e., from the time of arrival of the transition at the intermediate node until it has been admitted to the output latch.

NAND gate 258 receives as inputs DEL2 and notMASCLK, as does gate 240. It provides an output to an inverter 260, whose output supplies an input of an inverter 262 and an output signal notCLK2. The inverter 262 supplies the inverse, CLK2, of this output signal. As the signal CLK2 is taken at the output of 262, and is active high, it is active when both DEL2 and notMASCLK are high; i.e., at all times other than from the moment of application of the input, to the latching of the output into the output latches. CLK2 is hence equivalent in timing to IPU. It is generated separately to allow multiplexing of the outputs of the output latches. During the multiplexing of several PLA circuits, the unselected circuits have their CLK2 set low, to ensure that the output latch output pass gates 134 are non conductive. IPU must be set high, to hold the PLA in its initial state, with all inputs held high and output node precharge transistors conductive, to prevent the output nodes from floating.

The circuit of FIG. 10 functions as follows, with reference to FIG. 9: until a falling edge of MASCLK, at time t1, the output of NAND gate 240 is held high by the low value of notMASCLK. DEL2 is high at this time. IPU is therefore high. At time t1, MASCLK goes low; notMASCLK goes high, and the output of gate 240 goes low. This is doubly inverted, and delayed to some extent, by inverters 242, 244 to provide a falling edge on IPU and a rising edge on notIPU at time t2. A certain delay later, as explained above, signal DEL2 goes low at time t6; hence the output of gate 240 and so the signal IPU returns to a high state, and notIPU returns to a low state at time t8.

The output of NOR gate 252 is held low until the falling edge of the intermediate node signal notWI t3, indicating the arrival of the transition at the intermediate node, whereupon it goes high, around time t4, until the arrival t5 of a rising edge on signal DEL1, causing the output to return to its low state, and indicating that the transition has entered the output latch. This output is inverted twice, and hence delayed to provide the CLK1 signal, switching high at time t3, and returning to low at time t5 and being used to enable the input pass gates to the output latch.

The output of NAND gate 258 is held high by the low value of notMASCLK until a falling edge of MASCLK, at time t1. CLK2 is therefore high. DEL2 is high at this time.

At time t1, notMASCLK goes high, and the output of gate 258 goes low. This is inverted, and delayed to some extent, by inverters 242, 244 to provide a falling edge on CLK2 soon after time t1. A certain delay later, as explained above, signal DEL2 goes low at time t6, hence the output of gate 258 returns to a high state, as does the signal CLK2, at time t8.

Later, at time t9, the signal MASCLK returns to a high value. In a manner similar to the propagation of the falling edge already seen, this rising edge is propagated by the input driver emulator B4 and the input plane emulator B6, to arrive at time t10 at notWI. The transition is further propagated and delayed by the output plane emulator B10 and the output latch emulator B12 to cause a falling edge on signals DEL1 at time t11 and a rising edge on DEL2, at time t12.

The falling edge on notMASCLK t9 does not cause any change in output of NAND gates 240 or 258, as DEL2 is low throughout this transition, holding the outputs of these gates high. The rising edge on notWI t10 does not cause any change in the output of NOR gate 252, as DEL1 is high throughout this transition, holding the output of gate 252 low. Similarly, when DEL1 becomes low a certain delay later, t11 no change in output of the NOR gate 252 occurs, as notWI is high throughout the transition, keeping the output of this gate low. The change in DEL2 t12 also causes no change in the output of gates 240 and 258, as the signal notMASCLK remains low throughout this transition, holding the output of the NAND gates high.

Thus, no changes in the output signals IPU, notIPU, CLK1, notCLK1, CLK2 nor notCLK2 occur due to the rising edge t9 of MASCLK.

The functionality as required according to FIG. 9 is thus achieved.

Figure 11:
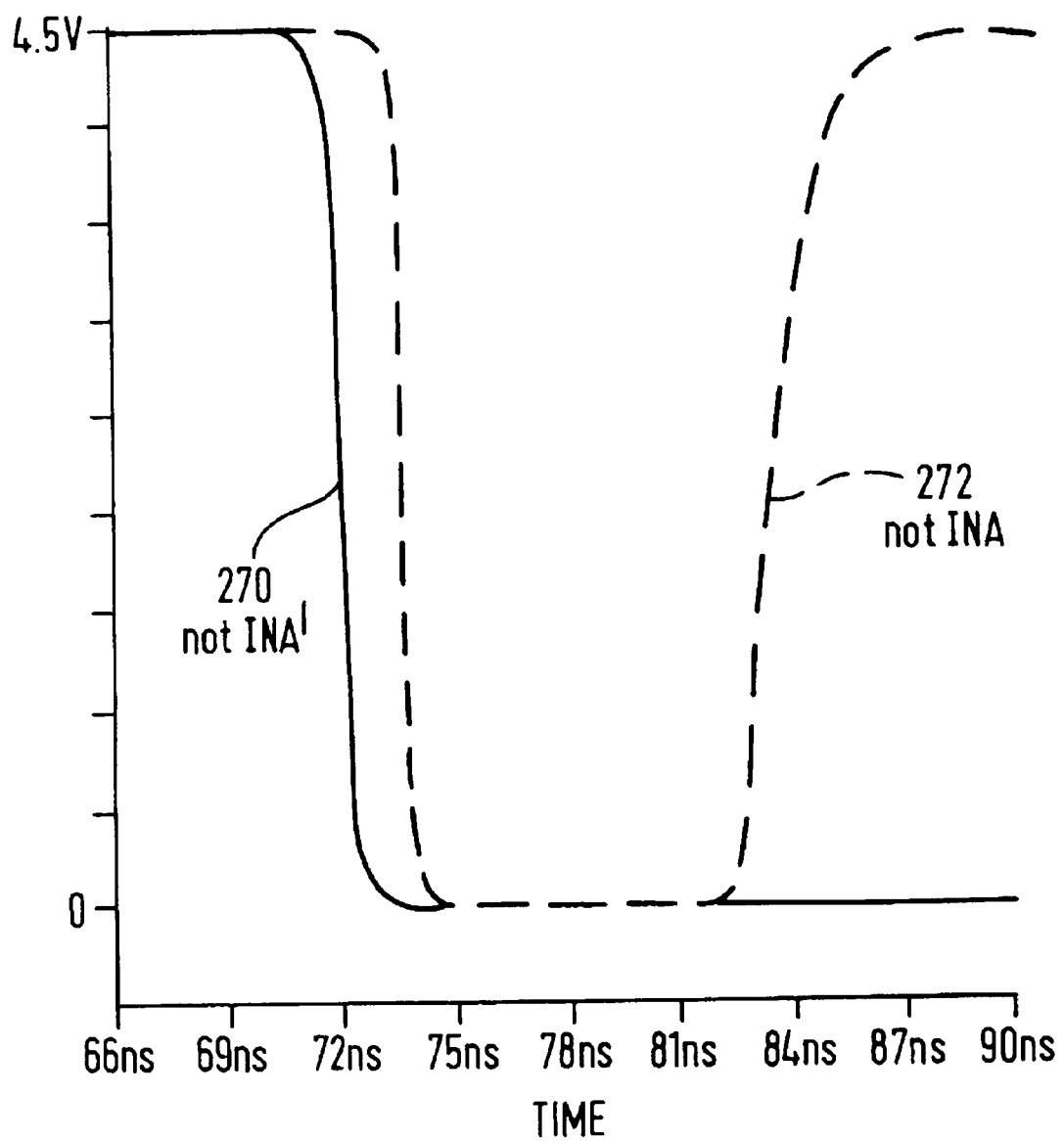
FIG. 11 shows simulation results for the voltage level at the input nodes of both dummy and actual PLAs.
Figure 12:
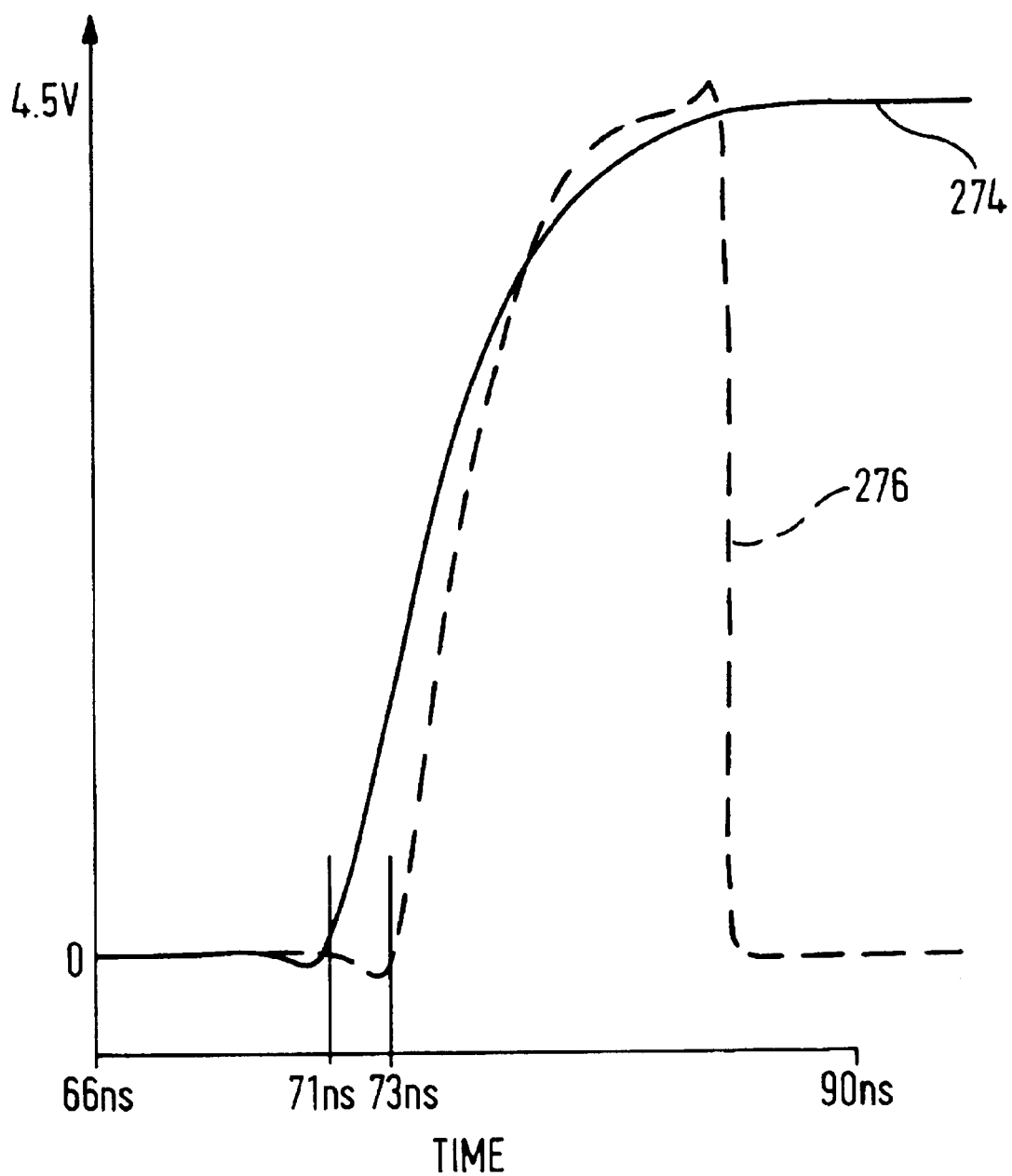
FIG. 12 shows simulation results for the voltage level at the intermediate nodes of both dummy and actual PLAs.
Figure 13:
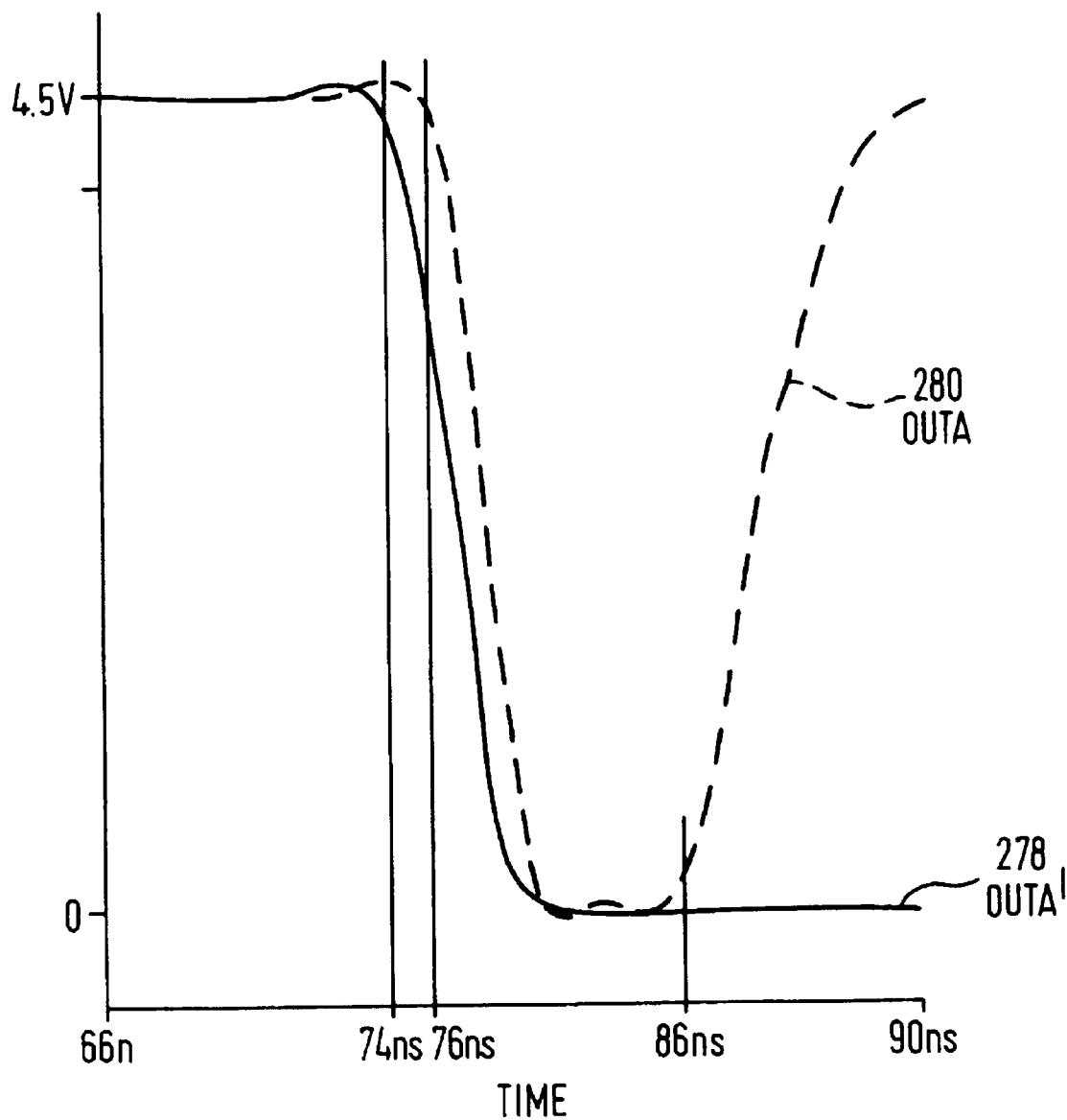
FIG. 13 shows simulation results for the voltage level at the output nodes of both dummy and actual PLAs.

FIGS. 11, 12 and 13 show the results of simulations performed on the circuit described, illustrating that the desired performance is achieved.

Each figure shows a signal at a node of the dummy PLA, together with a signal at the corresponding node of the real PLA. As the dummy PLA imparts a worst case delay at every stage of the circuit, the propagation of a transition through any particular stage will be slower in the dummy PLA than in the actual PLA. Thus, a transition arrives at a node of the actual PLA before a corresponding transition arrives at a corresponding node of the dummy PLA. In the actual PLA, propagation of the transition is stopped at certain points, until an active clock signal is received. In the dummy PLA, all clock signal inputs are held in the active state, so the transition is not stopped during its propagation. When a certain nodes in the dummy PLA change state, this transition is propagated to the clock generation circuitry illustrated in FIG. 10. This circuitry, composed of a number of logic gates connected in series, imparts a delay onto the propagation of the transition. The output of the clock generation circuitry is then supplied to the clock inputs of the actual PLA circuit, allowing the further propagation of the transition in the actual PLA. For this reason, a transition on the actual PLA can only take place after the corresponding transition has occurred in the dummy PLA, and this transition has given rise to a change in state of a clock signal supplied to a clock input of the actual PLA. This delay is at least equal to the propagation delay of the clock generation circuitry. Using the circuitry of FIG. 10, and according to the simulations, a difference in time of about 2 ns is observed between the transition of a signal on a node of the dummy PLA and a transition on the corresponding node of the actual PLA.

FIG. 11 shows the input node signals notINA', notINA in both the dummy PLA and the actual PLA circuits. The dummy PLA input node signal INA' 270 descends at 70 ns after the rising edge of MASCLK. With reference to FIG. 5B, this signal traverses the input plane emulator B6, to become the intermediate node signal notWI. NotWI is supplied to the clock generation logic B14, and supplies a clock signal IPU to the input driver A4 of the actual PLA, allowing the transition on notN_EN to be propagated as signal INA of the actual PLA circuit. The delay between the falling edges of INA' and INA is the sum of the propagation delay of the path through the input plane emulator B6 and the logic B14.

The actual PLA input node signal notINA 272 descends later, at 72 ns. After application of the input pull-up signal IPU, the actual PLA input node signal 272 rises to 4.5V at 83 ns but the dummy PLA input node signal remains at its low value. This simulation shows that the fall time of notINA', the dummy PLA signal, is slower than that of notINA, the actual PLA signal. This is due to the fact that the dummy PLA has a worst case loading at each stage. In all the simulations, for this reason, rise and fall times of dummy PLA circuits are slower that those of corresponding nodes in the actual PLA.

In FIG. 12, the intermediate node A8, B8 voltages 274, 276 of both the dummy and actual PLAs are shown. The dummy PLA intermediate node signal notWI, 274 rises at 71 ns after the rising edge of MASCLK. As discussed above, this is the output of the input plane emulator B6. This signal is transmitted to the clock generation logic B14, which provides the IPU signal. This signal applied the input signals to the input plane of the PLA, and leads to transitions occurring on intermediate nodes of the actual PLA. According to the simulation, the intermediate node signal 276 of the actual PLA rises at 73 ns, to redescend after the transmission of the intermediate node levels to the output nodes, at 86 ns. The intermediate node level 274 of the dummy PLA remains at its high value. The delay between the rising edges of the dummy and actual PLA intermediate node signals is caused by the propagation delay of notWI 274 through the logic B14. In this simulation, the difference is rise times of the two signals is particularly evident.

FIG. 13 shows the output node 200 signals OUTA', OUTA 278, 280 for both the dummy and the actual PLAs. The dummy PLA output node signal 278 switches at 74 ns, to a low level. With reference to FIGS. 5B, 8, 10, the transition on OUTA' causes a transitions on the DEL2 output of the output latch emulator B12. This causes clock signals IPU, notIPU to change state, leading to a transition on OUTA, 280, a short time later, at 76 ns. The actual PLA output node signal 280 returns to a high value at 86 ns, whereas the output node level of the dummy PLA 278 remains at a low value. Again, a longer rise time is seen in the signals of the dummy PLA. This is due to, and evidence of, the worst case capacitive loading applied to every stage of the dummy PLA.

Similar simulations could be performed for other pairs of corresponding nodes in the dummy and actual PLA circuits and also for other PLA circuits.

A method and circuit have thus been presented for operating a NOR-NOR PLA with dynamic pull-ups operating from a single phase of a clock signal.

A fast evaluation time, from the application of input signals to the provision of output signals is assured by applying clock signals accurately timed to suit the PLA circuit.

No nodes are left floating in the circuit and method described, avoiding any errors due to the discharging of floating nodes.

The invention described uses dynamic pull-ups, using much less current than used by PLAs with static pull-ups of the prior art, while ensuring minimum consumption by avoiding through currents.

The enable signals are applied to the relevant stages of the actual PLA. They become active at the earliest times that one can be sure that the required levels are present at each stage of the PLA, before enabling the following stage. By ensuring that the dummy PLA has, as far as possible, an identical layout to that of the actual PLA, an accurate timing is achieved, and the PLA then operates with the smallest delay possible between the arrival of the transition at each stage, and its transmission to the next stage of the PLA, ensuring fast operation.

Although the invention has been described with reference to a particular application in a flash memory device, the high speed and robustness of the circuitry of the invention is advantageous in any application which must tolerate high voltages and high noise levels, such as automotive and industrial environments. As the delay circuits reproduce exactly, in one embodiment, the circuitry of the actual PLA, the functioning of the circuitry of the invention is tolerant to temperature variations of the circuit. In an alternative embodiment, the delay circuits simulate the PLA circuitry and timing but are not identical.

A single dummy circuit may be used to time control signals to a number of PLAs, reducing the semiconductor surface area required, when compared to a circuit having a dummy circuit individually for each PLA.

I claim:

1. A clocked programmable logic array comprising:
    an input driver circuit for receiving input data and outputting the input data;
    an input plane having input nodes coupled to the input driver circuit for receiving the input data output from the input driver circuit and generating intermediate signals, said input nodes being held high except during evaluation of said input plane;
    an output plane coupled to the input plane for receiving the intermediate signals from the input plane and for generating an output signal;
    a clock emulation circuit for generating a clock signal;
    a clocked output stage coupled to the output plane and to the clock emulation circuit for receiving the output signal from the output plane and the clock signal from the clock emulation circuit and outputting the output signal under control of the clock signal from the clock emulation circuit; and
    an emulator circuit for emulating the time interval for the output signal to be generated after the input data is received by the input driver, said emulator circuit being coupled to the clock emulation circuit and controlling the output of the clock signal from the clock emulation circuit, said emulator circuit being arranged to receive a master clock signal whereby an operation cycle of said programmable logic array is arranged to be controlled in accordance with control signals triggered from a single edge of said master clock signal.

2. The programmable logic circuit according to claim 1 further including:
    an input plane emulator for emulating the time required for the intermediate signals to be generated by the input plane after the input plane receives the input data; and
    an input plane enable signal circuit coupled to the input plane for enabling the input plane to generate the intermediate signals under control of the input plane emulator.

3. The programmable logic circuit of claim 1 wherein the emulator circuit includes:

an output emulator circuit that generates an output enable signal, the output stage emulator circuit being coupled to the clock emulation circuit to generate an additional clock signal after a selected time interval.

4. A clocked output programmable logic array comprising:

an input latch circuit for receiving input data and enabling output of the data upon receipt of a latch enable signal;

an input driver circuit coupled to the input latch circuit;

an input plane coupled to the input driver circuit, said input plane being enabled by an input enable signal;

an output plane coupled to the input plane, said output plane being enabled by an output enable signal;

an output latch coupled to the output plane, said output latch being enabled to provide output signals under control of first and second clock signals;

a logic circuit generator circuit that generates the input enable signal, the output enable signal and the first and second clock signals; and an emulation circuit coupled to the logic circuit and receiving the latch enable signal simultaneously with the input latch receiving the latch enable signal, the emulation circuit outputting timing control signals to the logic circuit to control the generation of the input enable signal, the output enable signal and the first and second clock signals upon the emulation circuit receiving the latch enable signal, wherein said input latch circuit and said output latch circuit are arranged to prevent all nodes of said programmable logic array from floating during operation of the programmable logic array.

5. A method of operating a programmable logic array circuit, containing the stages of an input driver for receiving and outputting input data, an input plane coupled to the input driver via input nodes to receive said input data and to output intermediate signals, an output plane connected to the input plane to receive the intermediate signals and an output latch coupled to said output plane to provide an output signal, said method comprising;

holding the input node high except during evaluation of said input plane:

enabling each stage only during the time necessary for that stage to receive, propagate and output an incoming signal;

generating enable signals for each of the stages of the programmable logic array circuit using a dummy circuit which replicates components in the programmable logic array circuit in dimension and orientation such that the delay introduced by each stage in the dummy circuit is at least equal to the worst case delay experienced in the corresponding stage of the programmable logic array circuit; and receiving transition of a clock signal coincidentally at the input of an input driver of the dummy circuit and an input latch of the programmable logic array circuit to produce outputs of the dummy circuit which define the timing for applying and removing the enable signals from each stage of the programmable logic array circuit, wherein only a single transition of said clock signal is required to control an operation cycle of the programmable logic array.

6. A circuit for use with a plurality of programmable logic arrays comprising stages of delay circuitry which replicates, in dimension, orientation and interconnection, circuitry contained within stages of one of the programmable logic arrays, the stages being: an input driver for receiving and outputting input data, an input plane coupled to the input driver to receive said input data and to output intermediate signals, an output plane directly connected to the input plane to receive the intermediate signals and an output latch coupled to said output plane to provide an output signal, a transition of a clock signal being applied to an input driver emulator stage; the delay circuitry being designed so that each stage imparts a delay on an incoming signal at least equal to the delay imparted to an incoming signal by the corresponding stage of the one of the programmable logic arrays; and the time of arrival of the transition at certain stages being used to generate enable signals to more than one of the programmable logic arrays, wherein said circuit for use with the plurality of programmable logic arrays is separate from said programmable logic arrays and is arranged in parallel to at least one of the programmable logic arrays.

7. The circuit according to claim 6 wherein the input plane and the output plane both impart a NOR relationship on their outputs with respect to their inputs.

8. The circuit according to claim 6 integrated within a flash memory device.

9. The circuit according to claim 6 providing enable signals to a selected programmable logic array within a command user interface of a flash memory device.

10. An integrated circuit including a circuit according to claim 6, the enable signals being transmitted to the plurality of programmable logic arrays.

11. In combination, a plurality of clocked programmable logic arrays and an emulator, each of said programmable logic arrays comprising:

an input driver circuit for receiving input data and outputting the input data;

an input plane coupled to the input driver circuit for receiving the input data output from the input driver circuit and generating intermediate signals;

an output plane coupled to the input plane for receiving the intermediate signals from the input plane and for generating an output signal; and a clocked output stage coupled to the output plane and to a clock emulation circuit for receiving the output signal from the output plane and a clock signal from the clock emulation circuit and outputting the output signal under the control of the clock signal from the clock emulation circuit, said emulator comprising:

said clock emulation circuit for generating said clock signal; and an emulator circuit for emulating the time interval for the output signal to be generated after the input data is received by the input driver of each clocked programmable logic array, said emulator circuit being coupled to said clock emulation circuit and controlling the output of the clock signal from the clock emulation circuit, said emulator being separate from said programmable logic arrays and being arranged in parallel with each of said programmable logic arrays.

12. A combination as claimed in claim 11, wherein at least two programmable logic arrays are provided and said emulator is arranged in parallel with each of said programmable logic arrays.

13. In combination, a plurality of programmable logic arrays and an emulation circuit, each programmable logic array comprising:

an input driver circuit for receiving input data and outputting the input data;

an input plane coupled to the input driver circuit for receiving the input data output from the input driver circuit and generating intermediate signals;

an output plane coupled to the input plane for receiving the intermediate signals from the input plane and for generating an output signal;

a clock emulation circuit for generating a clock signal; and a clocked output stage coupled to the output plane and to the clock emulation circuit for receiving the output signal from the output plane and the clock signal from the clock emulation circuit, said emulation circuit being separate from said programmable logic arrays and arranged in parallel thereto, said emulation circuit being arranged to emulate the time interval for the output signal to be generated after the input data is received by the input driver of each programmable logic array, said emulator circuit being coupled to the clock emulation circuit and controlling the output of the clock signal from the clock emulation circuit of each programmable logic array.

14. A combination as claimed in claim 13, wherein at least two programmable logic arrays are provided and said emulation circuit is arranged in parallel with each of said programmable logic arrays.

15. A clocked programmable logic array comprising:

an input driver circuit for receiving input data and outputting the input data;

an input plane coupled to the input driver circuit for receiving the input data output from the input driver circuit and generating intermediate signals;

an output plane coupled to the input plane for receiving the intermediate signals from the input plane and for generating an output signal;

a clock emulation circuit for generating a clock signal;

a clocked output stage coupled to the output plane and to the clock emulation circuit for receiving the output signal from the output plane and the clock signal from the clock emulation circuit and for outputting the output signal under control of the clock signal from the clock emulation circuit;

an emulator circuit for emulating the time interval for the output signal to be generated after the input data is received by the input driver, said emulator circuit being coupled to the clock emulation circuit and controlling the output of the clock signal from the clock emulation circuit; and means for preventing all nodes of said programmable logic array from floating during operation of the programmable logic array.

16. A clocked programmable logic array as claimed in claim 15 wherein said preventing means are coupled to the output of the output stage.

17. A clocked programmable array as claimed in claim 16, wherein said preventing means comprise latch means connected to the output of said output stage.

18. A clocked programmable array as claimed in claim 15, wherein said preventing means are provided in said input driver circuit.

19. A clocked programmable array as claimed in claim 18, wherein said preventing means comprise latch means.

20. A flash memory device including a clocked programmable logic array comprising:

an input driver circuit for receiving input data and outputting the input data;

an input plane coupled to the input driver circuit for receiving the input data output from the input driver circuit and generating intermediate signals;

an output plane coupled to the input plane for receiving the intermediate signals from the input plane and for generating an output signal;

a clock emulation circuit for generating a clock signal;

a clocked output stage coupled to the output plane and to the clock emulation circuit for receiving the output signal from the output plane and the clock signal from the clock emulation circuit;

an emulator circuit for emulating the time interval for the output signal to be generated after the input data is received by the input driver, said emulator circuit being coupled to the clock emulation circuit and controlling the output of the clock signal from the clock emulation circuit; and means for preventing all nodes of said programmable logic array from floating during operation of the programmable logic array.

* * * * *